(12) United States Patent
Doebler et al.

(10) Patent No.: US 11,158,571 B2
(45) Date of Patent: Oct. 26, 2021

(54) DEVICES INCLUDING CONDUCTIVE INTERCONNECT STRUCTURES, RELATED ELECTRONIC SYSTEMS, AND RELATED METHODS

(71) Applicant: Micron Technology, Inc., Boise, ID (US)

(72) Inventors: Jonathan T. Doebler, Boise, ID (US); Scott L. Light, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 26 days.

(21) Appl. No.: 16/227,492

(22) Filed: Dec. 20, 2018

(65) Prior Publication Data
US 2020/0203272 A1 Jun. 25, 2020

(51) Int. Cl.
*H01L 23/522* (2006.01)
*H01L 23/532* (2006.01)
*H01L 21/768* (2006.01)

(52) U.S. Cl.
CPC .... *H01L 23/5226* (2013.01); *H01L 21/76804* (2013.01); *H01L 21/76807* (2013.01); *H01L 21/76831* (2013.01); *H01L 23/53257* (2013.01); *H01L 23/53295* (2013.01); *H01L 2221/1031* (2013.01)

(58) Field of Classification Search
CPC ........... H01L 21/76804; H01L 23/5226; H01L 23/53257; H01L 23/53295
See application file for complete search history.

(56) References Cited

U.S. PATENT DOCUMENTS

| 5,498,572 A | * | 3/1996 | Shiga | H01L 23/53223 148/DIG. 100 |
| 6,022,776 A | | 2/2000 | Lien et al. | |
| 6,143,601 A | * | 11/2000 | Sun | H01L 27/10894 438/253 |
| 7,029,946 B2 | * | 4/2006 | Murata | H01L 21/32051 257/E21.295 |

(Continued)

FOREIGN PATENT DOCUMENTS

| JP | 2004-274082 A | 9/2004 |
| KR | 10-2004-0063351 A | 7/2004 |

(Continued)

OTHER PUBLICATIONS

International Search Report for Application No. PCT/US2019/061931, dated May 8, 2020, 3 pages.

(Continued)

*Primary Examiner* — Lex H Malsawma
(74) *Attorney, Agent, or Firm* — TraskBritt

(57) ABSTRACT

A semiconductor device comprises conductive lines, a conductive landing pad in electrical communication with a conductive line of the conductive lines, and a conductive interconnect structure in electrical communication with the conductive landing pad. The conductive interconnect structure comprises a contact plug in electrical communication with the conductive landing pad, and a global interconnect contact in electrical communication with the contact plug and having a greater lateral width than the contact plug. Related electronic systems and method are also disclosed.

24 Claims, 19 Drawing Sheets

(56) References Cited

U.S. PATENT DOCUMENTS

| | | | |
|---|---|---|---|
| 2004/0152240 A1* | 8/2004 | Dangelo | H01L 21/76879 |
| | | | 438/122 |
| 2007/0123040 A1 | 5/2007 | Hwang et al. | |
| 2008/0251824 A1 | 10/2008 | Yamazaki | |
| 2009/0181521 A1* | 7/2009 | Hashimoto | H01L 23/5329 |
| | | | 438/465 |
| 2010/0127398 A1 | 5/2010 | Kim et al. | |
| 2012/0146181 A1 | 6/2012 | Lin et al. | |
| 2016/0027863 A1 | 1/2016 | Busch et al. | |
| 2016/0172363 A1 | 6/2016 | Doebler | |
| 2016/0233298 A1* | 8/2016 | Webb | H01L 29/41791 |
| 2018/0102366 A1 | 4/2018 | Wang | |

FOREIGN PATENT DOCUMENTS

| | | |
|---|---|---|
| TW | 201246476 A1 | 11/2012 |
| TW | 201530693 A | 8/2015 |
| TW | 201731022 A | 9/2017 |
| TW | 201830703 A | 8/2018 |

OTHER PUBLICATIONS

International Written Opinion for Application No. PCT/US2019/061931, dated May 8, 2020, 5 pages.
Taiwanese First Office Action for TW Application No. 108142849, dated Aug. 20, 2020, 13 pages.
Taiwanese Second Office Action for Application No. 108142849, dated Apr. 14, 2021, 14 pages.

\* cited by examiner

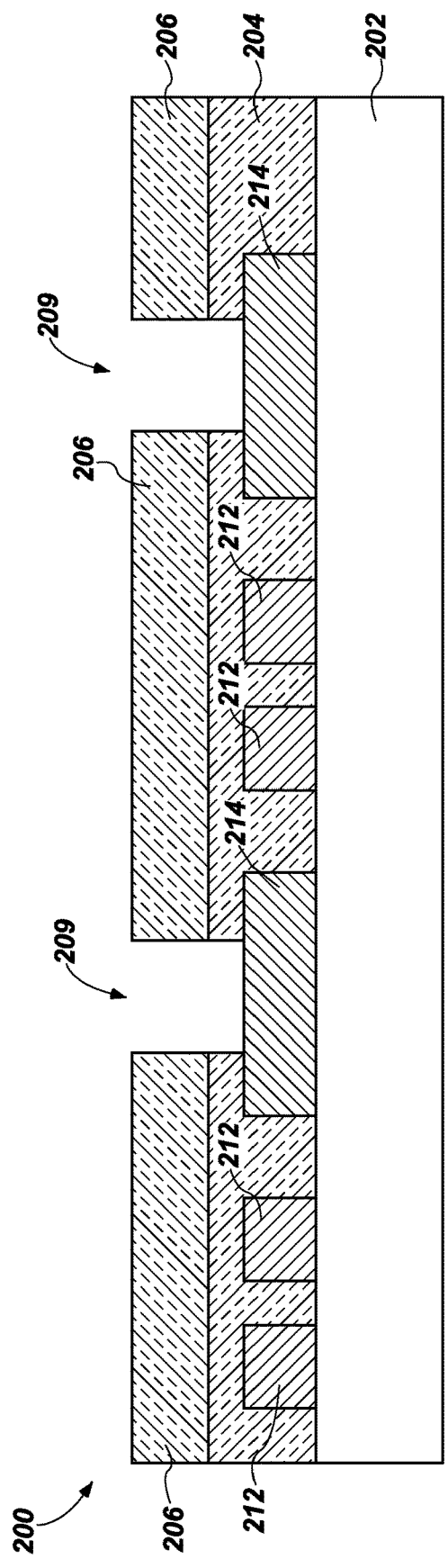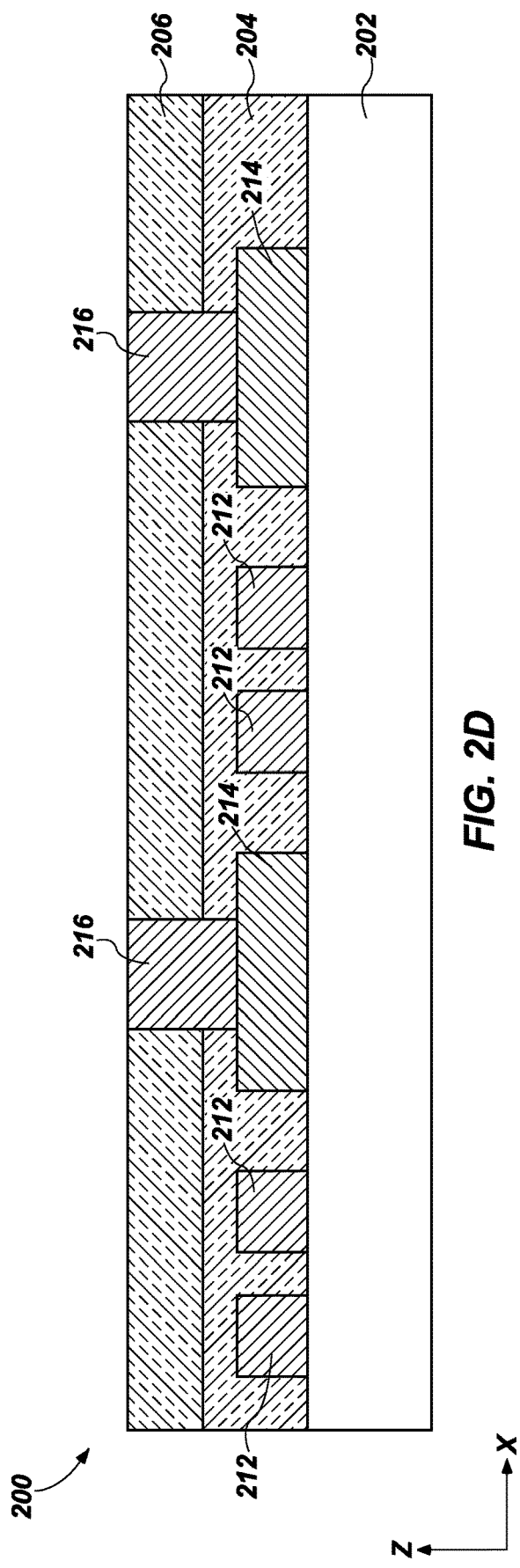

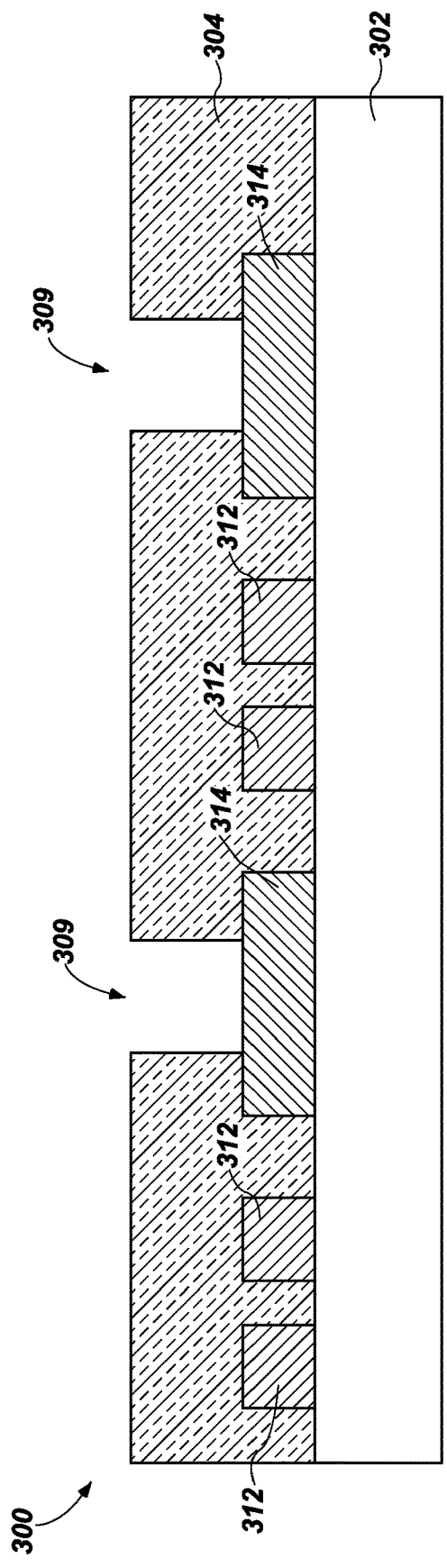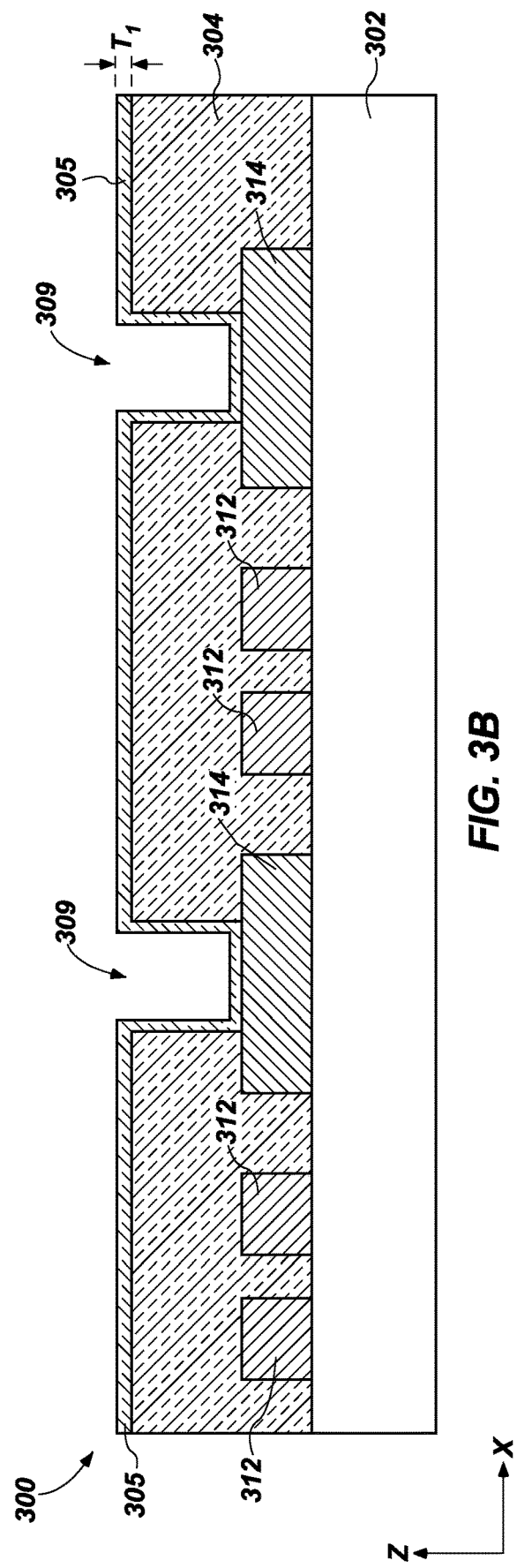

DEVICES INCLUDING CONDUCTIVE INTERCONNECT STRUCTURES, RELATED ELECTRONIC SYSTEMS, AND RELATED METHODS

TECHNICAL FIELD

Embodiments disclosed herein relate to semiconductor devices including conductive interconnect structures, to related electronic systems, and to related methods of forming semiconductor devices and electronic systems. More particularly, embodiments of the disclosure relate to semiconductor devices comprising conductive interconnect structures having high aspect ratios and in electrical communication with conductive landing pads, as well as to related electronic systems, and related methods of forming the semiconductor devices and electronic systems including the conductive interconnect structures.

BACKGROUND

Fabrication of semiconductor devices includes forming (e.g., patterning) one or more materials to have a desired feature size and feature spacing. For example, conductive materials may be patterned into conductive lines, such as access lines (e.g., word lines), digit lines (e.g., sense lines, bit lines), conductive contacts, redistribution lines, or other features.

Semiconductor device designers often desire to increase the level of integration or density of features within a semiconductor device by reducing the dimensions of individual features and by reducing the separation distance between neighboring features. In addition, semiconductor device designers often desire to design architectures that are not only compact, but offer performance advantages, as well as simplified designs.

As the pitch (i.e., spacing) of memory cells of a semiconductor device continues to shrink, corresponding electrical connections and circuitry must exhibit a similar reduction in pitch. However, the reduction in pitch increases the cost of fabrication of the semiconductor device. For example, to reduce feature sizes of the semiconductor device, manufacturers have used techniques such as pitch doubling to reduce the feature size of the semiconductor devices, wherein features are patterned, spacers are formed on sidewalls of the patterned features, and the patterned features are removed, leaving the spacers which were on the sidewalls of the patterned features. The remaining spacers are used to pattern one or more other features of the semiconductor device. Others have used quadruple patterning (also referred to as so-called "pitch quad" patterning) techniques to reduce the feature size. Quadruple patterning techniques include forming first spacers on sidewalls of patterned features and removing the patterned features, as in pitch doubling techniques. After the patterned features are removed, second spacers are formed on the first spacers and the first spacers are removed, leaving four second spacers for each initial patterned feature of the patterned features. Yet other methods of forming patterns having a smaller feature size include reverse pitch quad techniques, wherein spacers are formed on sidewalls of patterned features and the patterned features are removed, as in pitch doubling techniques. Thereafter, another material is formed between the spacers and the spacers are removed. Different features may be patterned through openings where the spacers were removed.

As the number of memory cells in a memory device increases, electrically connecting the memory cells to control logic circuitry and other components of the semiconductor device can create sizing and spacing complications associated with the increased quantities and dimensions of routing and interconnect structures required to facilitate the electrical connection. Adding to the complexity of the reduced feature sizes, some features may be electrically connected to global interconnect contact and routing lines, such as through conductive landing pads. However, global interconnect contact often have high aspect ratios, making them difficult to fabricate and reliably land on conductive landing pads. Accordingly, formation of global interconnect contact often requires relatively large conductive landing pads of sufficient size that the global interconnect contact can reliably be landed (formed) over the conductive landing pads. Relatively large conductive landing pads impede the ability to shrink feature sizes and feature pitch of the semiconductor device.

BRIEF DESCRIPTION OF THE DRAWINGS

FIG. 2A through FIG. 2H are simplified cross-sectional views illustrating a method of forming the semiconductor device of FIG. 1A through FIG. 1B, in accordance with embodiments of the disclosure;

FIG. 3A through FIG. 3F are simplified cross-sectional views illustrating a method of forming a semiconductor device, in accordance with embodiments of the disclosure;

DETAILED DESCRIPTION

Figure 1A:
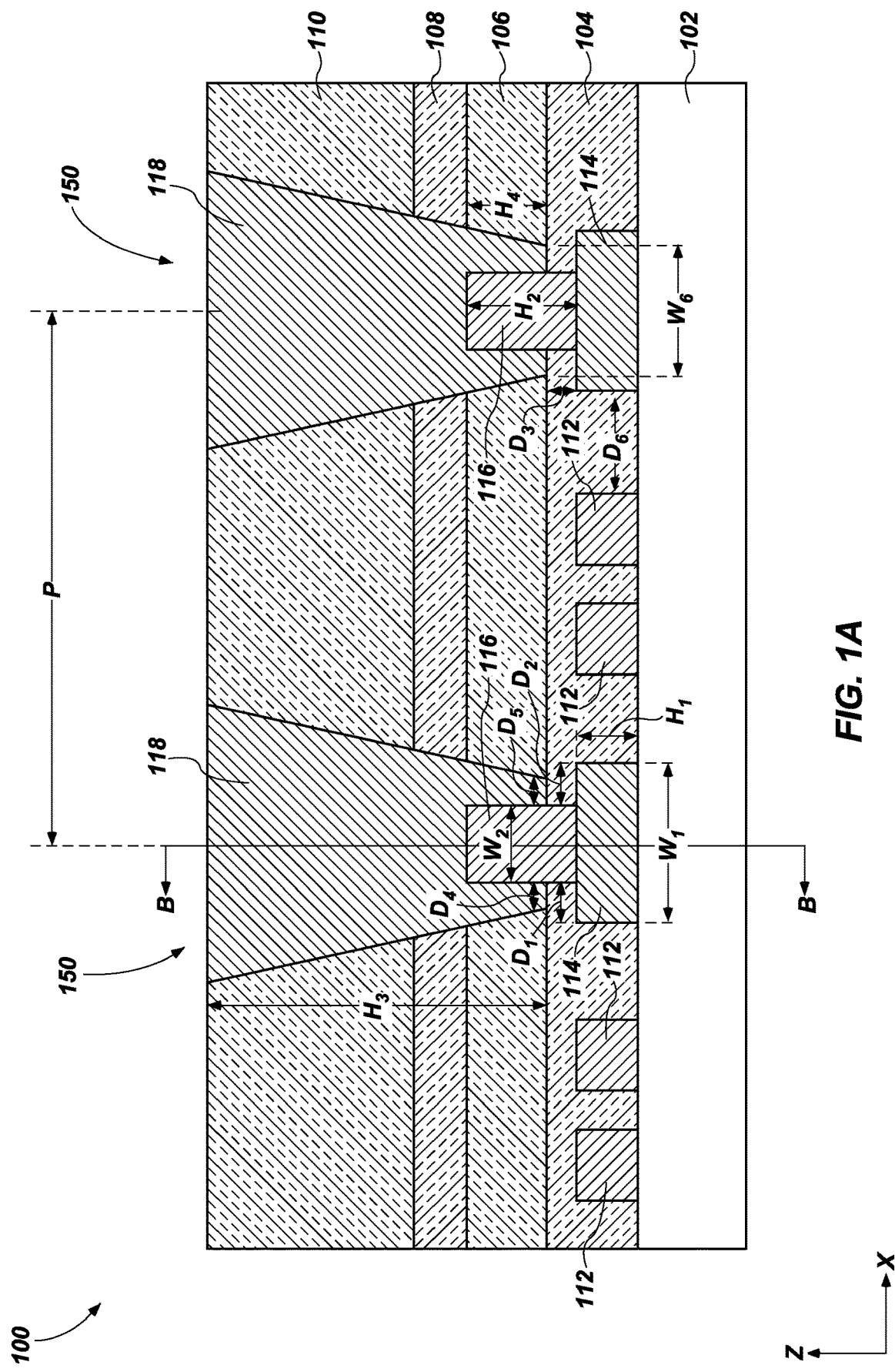
FIG. 1A and FIG. 1B are simplified cross-sectional views of a semiconductor device, in accordance with embodiments of the disclosure.

The illustrations included herewith are not meant to be actual views of any particular systems, semiconductor structures, or semiconductor devices, but are merely idealized representations that are employed to describe embodiments herein. Elements and features common between figures may retain the same numerical designation except that, for ease of following the description, for the most part, reference numerals begin with the number of the drawing on which the elements are introduced or most fully described.

The following description provides specific details, such as material types, material thicknesses, and processing conditions in order to provide a thorough description of embodiments described herein. However, a person of ordinary skill in the art will understand that the embodiments disclosed herein may be practiced without employing these specific details. Indeed, the embodiments may be practiced in conjunction with conventional fabrication techniques employed in the semiconductor industry. In addition, the description provided herein does not form a complete description of a semiconductor device or an electronic system, a semiconductor device or electronic system including conductive interconnect structures, or a complete description of a process flow for fabricating such semiconductor devices, electronic systems, and conductive interconnect structures. The structures described below do not form complete semiconductor device structures. Only those process acts and structures necessary to understand the embodiments described herein are described in detail below. Additional acts to form a complete semiconductor device, an electronic system, or conductive interconnect structures during fabrication of the semiconductor devices, electronic systems, or conductive interconnect structures may be performed by conventional techniques.

As used herein, the terms "longitudinal," "vertical," "lateral," and "horizontal" are in reference to a major plane of a substrate (e.g., base material, base structure, base construction) in or on which one or more structures and/or features are formed and are not necessarily defined by Earth's gravitational field. A "lateral" or "horizontal" direction is a direction that is substantially parallel to the major plane of the substrate, while a "longitudinal" or "vertical" direction is a direction that is substantially perpendicular to the major plane of the substrate. The major plane of the substrate is defined by a surface of the substrate having a relatively large area compared to other surfaces of the substrate.

As used herein, the term "substantially" in reference to a given parameter, property, or condition means and includes to a degree that one of ordinary skill in the art would understand that the given parameter, property, or condition is met with a degree of variance, such as within acceptable tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, an "electrically conductive material" may refer to one or more of a metal, such as tungsten, titanium, nickel, platinum, ruthenium, rhodium, aluminum, copper, molybdenum, gold, iridium, a metal alloy, a metal-containing material (e.g., metal nitrides (e.g., titanium nitride (TiN), tungsten nitride (WN), tantalum nitride (TaN), titanium aluminum nitride (TiAlN))), metal silicides, metal carbides, metal oxides (e.g., iridium oxide ($IrO_x$), ruthenium oxide ($RuO_x$)), a conductively-doped semiconductor material (e.g., conductively-doped silicon, conductively-doped germanium, conductively-doped silicon germanium), polysilicon, other materials exhibiting electrical conductivity, or combinations thereof.

According to embodiments described herein, a semiconductor device including one or more conductive interconnect structures is disclosed. The conductive interconnect structures may be located above a base material of the semiconductor device. For example, the conductive interconnect structures may be located above transistors of memory cells, CMOS transistors located within the base material, a clock tree module, or other control circuitry of the semiconductor device. The conductive interconnect structures may be located in a peripheral portion of the semiconductor device (e.g., outside of a memory array region) or in a region between the memory array region and the peripheral portion.

The conductive interconnect structures may be used for electrically connecting, for example, global metallization lines to local interconnect lines. The local interconnect lines may be in electrical communication with output signal lines (e.g., digit lines of a memory array), which in turn, may be connected to one or more components of the semiconductor device, such as one or more access devices (e.g., transistors, such as a source region or a drain region, or a transistor gate), which may comprise a portion of a memory cell in a memory array region of the semiconductor device. In some embodiments, the local interconnect lines may be in electrical communication with, for example, a sense amplifier that may be configured to amplify a voltage difference between bit lines or digit lines of the semiconductor device during a sense (e.g., read) operation. In some embodiments, the global metallization lines may be configured to provide power to one or more components or devices of the semiconductor device, which may be configured to drive one or more circuits of the semiconductor device. The conductive interconnect structures may include a contact plug in electrical communication with a conductive landing pad. The conductive landing pad may comprise a portion of a conductive line (e.g., a local interconnect line) and the conductive landing pad may be in electrical communication with the global metallization line. A global interconnect contact may be in electrical communication with the contact plug. The global interconnect contact may have a greater dimension than the contact plug and may have an aspect ratio greater than about 10:1, such as greater than about 20:1, or even greater than about 40:1. In some embodiments, the global interconnect contact may substantially surround and wrap around the contact plug, increasing a contact area between the global interconnect contact and the contact plug, and reducing a contact resistance of the conductive interconnect structure. The contact plug may be formed to have a relatively small aspect ratio (e.g., an aspect ratio less than about 2.0:1.0). The relatively small aspect ratio of the contact plug facilitates improved reliability and electrical connection of the contact plug to the conductive landing pad and allows for reducing a lateral footprint of the conductive landing pad compared to conventional conductive landing pads. Since the global interconnect contact substantially surrounds and wraps around the contact plug, the contact area of the conductive interconnect structure is increased and the contact resistance is reduced. Since the conductive landing pads have a smaller lateral footprint compared to conventional conductive landing pads, other features proximate the conductive landing pads (e.g., other local interconnect lines, metal lines, digit lines) may be formed at a greater pitch without the requirement of performing pitch quadrupling or other costly pitch multiplication techniques to achieve relatively small pitches.

Figure 1B:
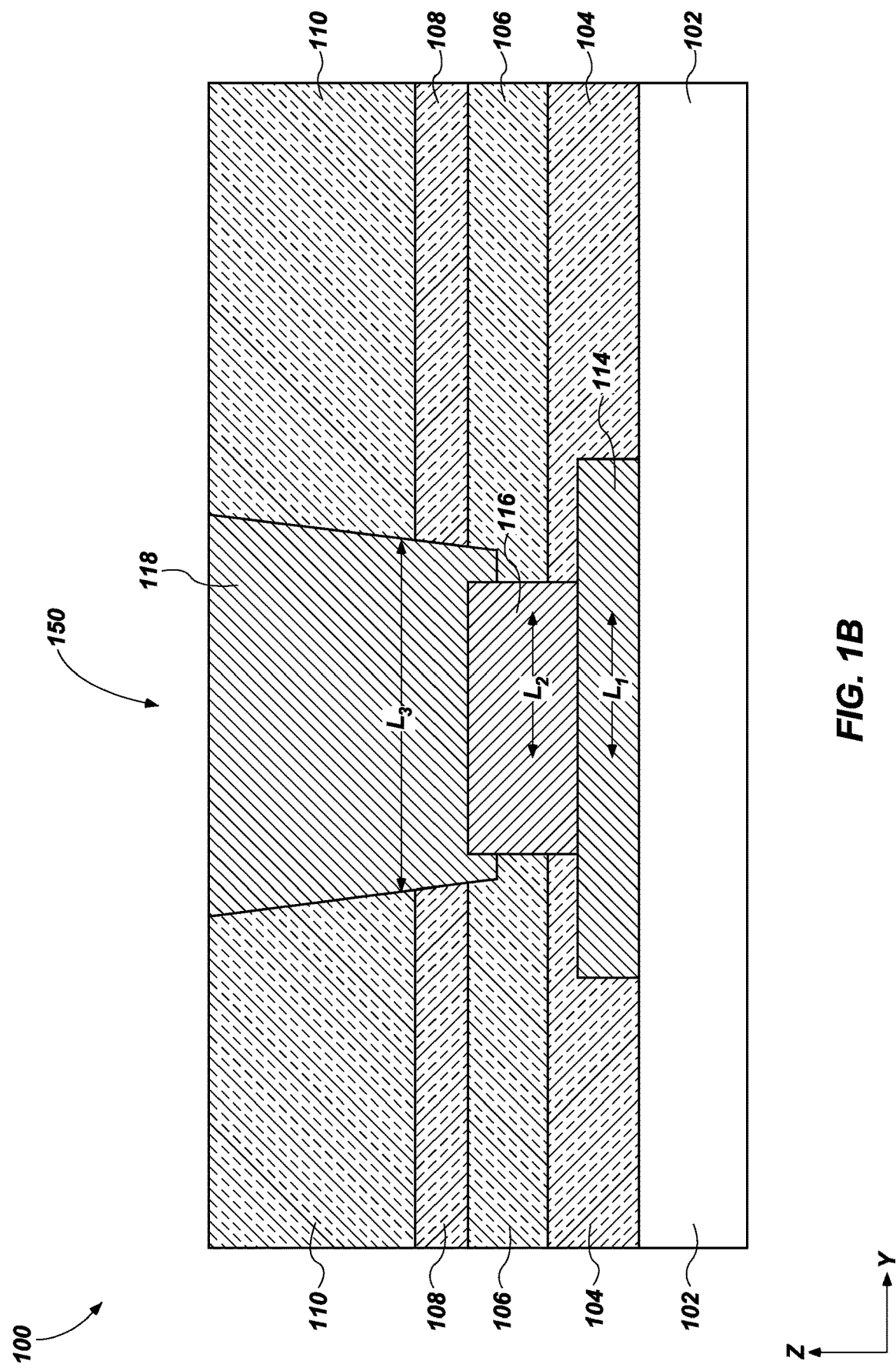

FIG. 1A and FIG. 1B are simplified cross-sectional views of a semiconductor device 100, in accordance with embodiments of the disclosure. The cross-sectional views of FIG. 1A and FIG. 1B illustrate a peripheral region of the semiconductor device 100. With reference to FIG. 1A, the semiconductor device 100 may include a nitride material 104 over a base material 102, a dielectric material 106 over the nitride material 104, another nitride material 108 over the dielectric material 106, and another dielectric material 110 over the other nitride material 108.

The base material 102 may include a semiconductor substrate, a base semiconductor material on a supporting substrate, a metal electrode, or a semiconductor substrate having one or more materials, structures, or regions formed thereon. The base material 102 may be a conventional silicon substrate or other bulk substrate including semiconductor material. As used herein, the term "bulk substrate" means and includes not only silicon wafers, but also silicon-on-insulator ("SOT") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" or "base material" in the following description, previous process stages may have been utilized to form material, regions, or junctions in the base semiconductor structure or foundation. The base material 102 may include one or more materials associated with integrated circuitry fabrication. Such materials may include, for example, one or more of refractory metals, barrier materials, diffusion materials, and insulative materials. The base material 102 may include, for example, complementary metal oxide semiconductor (CMOS) structures, or other semiconductor structures. Different portions of the base material 102 may be electrically isolated from each other by one or more dielectric materials.

The base material 102 may include one or more components of, for example, a memory cell. By way of non-limiting example, the base material 102 may include one or more semiconductor components, such as one or more of transistors (e.g., including, for example, a channel region between a pair of source/drain regions, and a gate configured to electrically connect the source/drain regions to one another through the channel region), sense amplifiers (e.g., equalization (EQ) amplifiers, isolation (ISO) amplifiers, NMOS sense amplifiers (NSAs), PMOS sense amplifiers (PSAs)), charge pumps (e.g., $V_{CCP}$ charge pumps, $V_{NEWWL}$ charge pumps, DVC2 charge pumps), delay-locked loop (DLL) circuitry (e.g., ring oscillators), drain supply voltage ($V_{dd}$) regulators, decoders, (e.g., column decoders, row decoders), word line (WL) drivers, repair circuitry (e.g., column repair circuitry, row repair circuitry), I/O devices (e.g., local I/O devices), test devices, array multiplexers (MUX), error checking and correction (ECC) devices, self-refresh/wear leveling devices, a clock tree module, and various control circuitry.

With reference to FIG. 1A and FIG. 1B, the nitride material 104 may overlie the base material 102 in the peripheral region and in the array region. The nitride material 104 may comprise silicon nitride ($Si_3N_4$), silicon oxynitride, another nitride, or combinations thereof. In some embodiments, the nitride material 104 comprises silicon nitride.

The dielectric material 106 may be formed of and include one or more dielectric materials having an etch selectivity relative to the nitride material 104. Stated another way, the dielectric material 106 may be formulated and configured to be removed responsive to exposure to one or more materials that may not substantially remove the nitride material 104 at the same rate (if at all). By way of non-limiting example, the dielectric material 106 may comprise an oxide dielectric material, such as one or more of silicon dioxide (Sift), phosphosilicate glass, borosilicate glass, borophosphosilicate glass, fluorosilicate glass, and aluminum oxide ($Al_2O_3$). In some embodiments, the dielectric material 106 comprises silicon dioxide.

The other nitride material 108 may be formed of and include one or more materials having an etch selectivity relative to the dielectric material 106. By way of non-limiting example, the other nitride material 108 may be formed of and include silicon nitride, silicon oxynitride, another nitride material, or combinations thereof. In some embodiments, the other nitride material 108 has the same material composition as the nitride material 104.

The other dielectric material 110 may be formed of and include one or more materials having an etch selectivity relative to the other nitride material 108. By way of non-limiting example, the other dielectric material 110 may be formed of and include one or more of silicon dioxide, phosphosilicate glass, borosilicate glass, borophosphosilicate glass, fluorosilicate glass, and aluminum oxide. In some embodiments, the other dielectric material 110 comprises silicon dioxide. The other dielectric material 110 may have the same material composition as the dielectric material 106.

With continued reference to FIG. 1A, conductive lines 112 and conductive landing pads 114 may be located within the nitride material 104 in the peripheral region of the semiconductor device 100. The conductive lines 112 and the conductive landing pads 114 may be referred to as local interconnects for forming local electrical connections to one or more components of the semiconductor device 100, such as to one or more of transistors (e.g., including, for example, a channel region between a pair of source/drain regions, and a gate configured to electrically connect the source/drain regions to one another through the channel region), sense amplifiers (e.g., equalization (EQ) amplifiers, isolation (ISO) amplifiers, NMOS sense amplifiers (NSAs), PMOS sense amplifiers (PSAs)), charge pumps (e.g., $V_{CCP}$ charge pumps, $V_{NEWWL}$ charge pumps, DVC2 charge pumps), delay-locked loop (DLL) circuitry (e.g., ring oscillators), drain supply voltage ($V_{dd}$) regulators, decoders, (e.g., column decoders, row decoders), word line (WL) drivers, repair circuitry (e.g., column repair circuitry, row repair circuitry), I/O devices (e.g., local I/O devices), test devices, array multiplexers (MUX), error checking and correction (ECC) devices, self-refresh/wear leveling devices, a clock tree module. The conductive landing pads 114 may be in electrical communication with a conductive line 112 in a plane other than the cross-sectional view illustrated in FIG. 1A. In the cross-sectional view illustrated in FIG. 1A, the conductive lines 112 are not illustrated as being in electrical communication with a conductive landing pad 114. It will be understood that in a different plane, the conductive lines 112 may be in electrical communication with a conductive landing pad 114 and that conductive landing pads 114 associated with other conductive lines 112 may be in electrical communication with a respective conductive line 112 in a different plane.

By way of non-limiting example, the conductive lines 112 may be electrically connected to portions of transistors located within the base material 102. For example, at least some of the conductive lines 112 may be in electrical communication with digit lines, bit lines, sense lines, or other conductive lines which may be operably coupled to transistors associated with a memory cell in a memory array, which may be used for sensing a state of one or more memory cells through a sense amplifier. For example, each memory cell in a memory array may be operably coupled to a digit line. The digit lines within the memory array may extend to an edge or peripheral portion of the memory array, where they may be contacted with a conductive line 112. In some embodiments, the conductive lines 112 are in electrical communication with transistors in the peripheral region of the semiconductor device 100. The transistors may be in operable communication with a sense amplifier and may be configured to selectively couple one or more of the digit lines to the sense amplifier associated with a respective transistor to which the digit line is coupled. Accordingly, in some embodiments, the transistors may be configured to provide electrical communication between the sense amplifier and a conductive line 112 operably coupled to sense amplifier via a transistor. The conductive line 112, in turn, may be in operable communication with a digit line that extends into the memory array.

The conductive lines 112 may each include a conductive landing pad 114. Although FIG. 1A illustrates that some of the conductive lines 112 do not include conductive landing pads 114, it will be understood that such conductive lines 112 include conductive landing pads 114 in a different cross-section than that illustrated. The conductive lines 112 may each be electrically coupled to a global interconnect line via conductive interconnect structures 150, which may each individually comprise a conductive landing pad 114 in electrical communication with a conductive plug 116, and a global interconnect contact 118 in electrical communication with the conductive plug 116. The conductive plug 116 may extend through a portion of the nitride material 104 and be electrically connected to a conductive landing pad 114. A portion of the conductive plug 116 may extend into the global interconnect contact 118. Accordingly, the conductive plug 116 may be in electrical communication with the conductive landing pad 114 and the global interconnect contact 118. The global interconnect contact 118 may substantially surround an upper portion of the conductive plug 116. As will be described herein, the conductive plug 116 may facilitate formation of the global interconnect contact 118 to have a high aspect ratio and to be formed in electrical communication with the conductive landing pad 114 without falling off of the conductive landing pad 114 or without the failure of the electrical connections between components of the conductive interconnect structures 150.

The conductive lines 112, the conductive landing pads 114, the contact plugs 116, and the global interconnect contact 118 may each individually comprise an electrically conductive material. The conductive lines 112, the conductive landing pads 114, the contact plugs 116, and the global interconnect contact 118 may have the same material composition as one another, or may have different material compositions than one another. In some embodiments, the contact plugs 116 and the global interconnect contact 118 have the same material composition. In other embodiments, the contact plugs 116 and the global interconnect contact 118 have different material compositions than one another. In some embodiments, the conductive lines 112 comprise tungsten. In some embodiments, the conductive landing pads 114 comprise tungsten. In some embodiments, the contact plugs 116 and the global interconnect contact 118 comprise tungsten.

In some embodiments, the global interconnect contact 118 may be in electrical communication with a power source and may be configured to provide power to one or more components (e.g., one or more driver circuits, such as word line drivers) of the semiconductor device 100, such as through electrical connections to the conductive landing pads 114 by means of the conductive plug 116. In some embodiments, the global interconnect contact 118 may be configured to provide power to, for example, sense amplifiers in operable communication with the conductive lines 112.

A pitch P of the conductive interconnect structures 150 may be within a range from about 500 nm to about 1,500 nm, such as from about 500 nm to about 1,000 nm, or from about 1,000 nm to about 1,500 nm. The pitch P may be defined as a center-to-center distance between features of the conductive interconnect structures 150.

Although FIG. 1A illustrates only two conductive lines 112 between adjacent conductive interconnect structures 150, the disclosure is not so limited. In other embodiments, the semiconductor device 100 may include greater than or equal to 4, greater than or equal to 8, greater than or equal to 12, or greater than or equal to 16 conductive lines 112 between adjacent conductive interconnect structures 150.

The conductive landing pads 114 may have a width $W_1$ within a range of from about 30 nm to about 60 nm, such as from about 30 nm to about 40 nm, from about 40 nm to about 50 nm, or from about 50 nm to about 60 nm. In some embodiments, the width $W_1$ is about 45 nm. A height $H_1$ of the conductive landing pads 114 may be within a range from about 10 nm to about 40 nm, such as from about 10 nm to about 20 nm, from about 20 nm to about 30 nm, or from about 30 nm to about 40 nm. In some embodiments, the height $H_1$ is about 25 nm.

The conductive plug 116 may have a width $W_2$ within a range of from about 10 nm to about 50 nm, such as from about 10 nm to about 20 nm, from about 20 nm to about 30 nm, from about 20 nm to about 40 nm, or from about 40 nm to about 50 nm. In some embodiments, the width $W_2$ is about 30 nm. A height $H_2$ of the conductive plug 116 may be within a range from about 20 nm to about 250 nm, such as from about 20 nm to about 50 nm, from about 50 nm to about 100 nm, from about 100 nm to about 150 nm, from about 150 nm to about 200 nm, or from about 200 nm to about 250 nm. In some embodiments, the height $H_2$ is about 40 nm.

An aspect ratio, defined as a ratio of the height $H_2$ to the width $W_2$ of the contact plug 116 may be within a range from about 1.0:1.0 to about 10.0:1.0, such as from about 1.0:1.0 to about 2.0:1.0, from about 2.0:1.0 to about 5.0:1.0, or from about 5.0:1.0 to about 10.0:1.0. In some embodiments, the aspect ratio of the contact plug 116 is less than about 2.0:1.0. As will be described herein, it is believed that the relatively low aspect ratio of the contact plug 116 facilitates formation of the contact plug 116 on the conductive landing pad 114 without requiring the width $W_1$ of the conductive landing pad 114 to be as large as in conventional semiconductor devices.

In some embodiments, a distance $D_1$ between a lateral side of the conductive plug 116 and a lateral side of the conductive landing pad 114 is within a range from about 5 nm to about 20 nm, such as from about 5 nm to about 10 nm, from about 10 nm to about 15 nm, or from about 15 nm to about 20 nm. In some embodiments, the distance $D_1$ is about 7.5 nm. A distance $D_2$ between another lateral side of the conductive plug 116 and another lateral side of the conductive landing pad 114 may be within a range from about 5 nm to about 20 nm, such as from about 5 nm to about 10 nm, from about 10 nm to about 15 nm, or from about 15 nm to about 20 nm. In some embodiments, the distance $D_1$ is about 7.5 nm. In some embodiments, the distance $D_1$ is equal to about the distance $D_2$. However, in other embodiments, the conductive plug 116 may be laterally offset with respect to the conductive landing pad 114 and the distance $D_1$ may be different than the distance $D_2$.

With continued reference to FIG. 1A, a distance $D_3$ between a surface of the conductive landing pad 114 and a surface of the global interconnect contact 118 may be within a range from about 10 nm to about 40 nm, such as from about 10 nm to about 20 nm, from about 20 nm to about 30 nm, or from about 30 nm to about 40 nm. In some embodiments, the distance $D_3$ is about 20 nm.

The conductive plug 116 may extend into the global interconnect contact 118 a distance corresponding to a height $H_4$ of the dielectric material 106. In some embodiments, the height $H_4$ may be greater than the distance $D_3$ by which the surface of the conductive landing pad 114 is separated from the surface of the global interconnect contact 118. In some embodiments, the global interconnect contact 118 may contact the contact plug 116 proximate at least three surfaces thereof (e.g., on sidewalls of the contact plug 116 and on an upper surface of the contact plug 116). In some such embodiments, the contact between the global interconnect contact 118 and the contact plug 116 may be referred to herein as a so-called 3D contact.

A distance $D_4$ between a lateral side of the conductive plug 116 and a side of the global interconnect contact 118 may be within a range from about 5 nm to about 40 nm, such as from about 5 nm to about 10 nm, from about 10 nm to about 20 nm, from about 20 nm to about 30 nm, or from about 30 nm to about 40 nm. In some embodiments, the distance $D_4$ ranges from about 15 nm to about 20 nm. A distance $D_5$ between another lateral side of the conductive plug 116 and another one of the global interconnect contacts 118 may be within a range from about 5 nm to about 40 nm, such as from about 5 nm to about 10 nm, from about 10 nm to about 20 nm, from about 20 nm to about 30 nm, or from about 30 nm to about 40 nm. In some embodiments, the distance $D_5$ is within a range of from about 15 nm to about 20 nm. In some embodiments, the distance $D_4$ is equal to the distance $D_5$. In some such embodiments, the conductive plug 116 may be substantially laterally centered with respect to the global interconnect contact 118. However, in other embodiments, the distance $D_4$ and the distance $D_5$ may be different and the conductive plug 116 may be laterally offset from the global interconnect contact 118. As will be described herein, the contact plug 116 may facilitate maintaining electrical connections between components of the conductive interconnect structures 150 even when the global interconnect contact 118 is laterally offset from the conductive landing pad 114.

The global interconnect contact 118 may have a height $H_3$ within a range from about 500 nm to about 2,000 nm, such as from about 500 nm to about 750 nm, from about 750 nm to about 1,000 nm, from about 1,000 nm to about 1,500 nm, or from about 1,500 nm to about 2,000 nm. In some embodiments, the height $H_3$ is about 1,000 nm.

A width $W_6$ of at least a portion of the global interconnect contact 118 (i.e., the portion of the global interconnect contact 118 proximate and in contact with the conductive plug 116) may be within a range from about 50 nm to about 100 nm, such as from about 50 nm to about 60 nm, from about 60 nm to about 70 nm, from about 70 nm to about 80 nm, from about 80 nm to about 90 nm, or from about 90 nm to about 100 nm. Although FIG. 1A illustrates that the global interconnect contact 118 comprises angled sidewalls, the disclosure is not so limited. In other embodiments, the sidewalls of the global interconnect contact 118 may be substantially vertical (i.e., substantially perpendicular to a major surface of the base material 102).

An aspect ratio of the global interconnect contact 118 may be within a range from about 1:5 to about 1:100, such as from about 1:5 to about 1:10, from about 1:10 to about 1:20, from about 1:20 to about 1:40, from about 1:40 to about 1:60, from about 1:60 to about 1:80, or from about 1:80 to about 1:100. In some embodiments, the aspect ratio of the global interconnect contact 118 is about 1:40.

In some embodiments, as the width $W_1$ of the conductive landing pad 114 increases, a distance $D_6$ between a sidewall of the conductive landing pads 114 and a sidewall of the conductive lines 112 may decrease. As the distance $D_6$ decreases, the pitch and corresponding width $W_7$ of the conductive lines 112 may be forced to decrease. However, as the width $W_7$ decreases, a difficulty of patterning the conductive lines 112 increases and may require, for example, various pitch multiplication techniques. According to embodiments described herein, the width $W_1$ of the conductive landing pad 114 is reduced, providing additional space for the conductive lines 112. Since the global interconnect contact 118 substantially wraps around the contact plug 116, a contact area between the contact plug 116 and the global interconnect contact 118 is increased and the corresponding contact resistance is decreased. In addition, since the contact plug 116 is formed with a relatively low aspect ratio, the contact plug 116 is accurately and reliably landed on the conductive landing pad 114, reducing a risk of failure of the conductive interconnect structure 150 or shorting of the global interconnect contact 118 to other features of the semiconductor device 100. By way of contrast, conventional interconnects to conductive landing pads may be made through high aspect ratio openings. However, forming the interconnect through high aspect ratio openings may require conductive landing pads having a relatively higher width than the width $W_1$ described herein to reliably land the interconnect on the conductive landing pad.

FIG. 1B is a simplified cross-sectional view of the semiconductor device 100 illustrating the conductive interconnect structure 150. A length $L_1$ of the conductive landing pad 114 in a direction (e.g., the y-direction) perpendicular to the width $W_1$ of the conductive landing pad 114 may be within a range from about 100 nm to about 300 nm, such as from about 100 nm to about 150 nm, from about 150 nm to about 200 nm, from about 200 nm to about 250 nm, or from about 250 nm to about 300 nm. In some embodiments, the length $L_1$ of the conductive landing pad 114 may be greater than the width $W_1$ thereof. Although $L_1$ has been described as ranging from about 100 nm to about 300 nm, the disclosure is not so limited. In some embodiments, the length $L_1$ may be greater than about 300 nm.

A length $L_2$ of the contact plug 116 may be within a range from about 50 nm to about 200 nm, such as from about 50 nm to about 100 nm, from about 100 nm to about 150 nm, or from about 150 nm to about 200 nm. In some embodiments, the length $L_2$ of the contact plug 116 may be greater than the width $W_2$ thereof.

A length $L_3$ of the global interconnect contact 118 may be within a range from about 5 nm to about 30 nm, such as from about 5 nm to about 10 nm, from about 10 nm to about 20 nm, of from about 20 nm to about 30 nm. In some embodiments, the length $L_3$ of the global interconnect contact 118 may be less than the width $W_6$ thereof. In some embodiments, the conductive landing pad 114 and the contact plug 116 may have a greater dimension in a first direction (e.g., the y-direction) than in a second direction (e.g., the x-direction), while the global interconnect contact 118 has a greater dimension in the first direction than in the second direction.

In some embodiments, even though the width $W_1$ of the conductive landing pad 114 may be reduced relative to a width of a conventional conductive landing pad, the global interconnect contact 118 may be formed in electrical communication with the conductive landing pad 114 due to the length $L_1$ of the conductive landing pad 114 and due to the length $L_2$ and height $H_2$ (e.g., due to the height $H_4$ that the conductive plug 116 extends into the global interconnect contact 118).

Figure 2A:
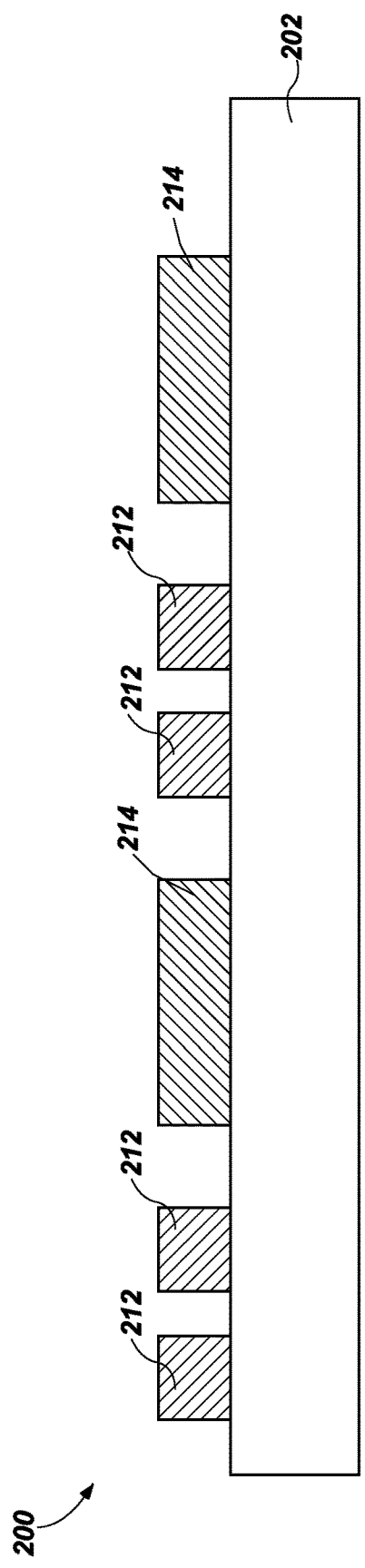

FIG. 2A through FIG. 2H, are simplified cross-sectional views illustrating a method of forming the semiconductor device 100 of FIG. 1A. Referring to FIG. 2A, a semiconductor device 200 includes a base material 202 and a pattern of conductive lines 212 over the base material 202. The base material 202 and the conductive lines 212 may be substantially the same as the base material 102 and the conductive lines 112, respectively, described above with reference to FIG. 1A. The views illustrated in FIG. 2A through FIG. 2H show a peripheral portion of the semiconductor device 200. Although FIG. 2A does not illustrate components of the base material 202, it will be understood that the base material 202 may include one or more semiconductor components, such as one or more of transistors (e.g., including, for example, a channel region between a pair of source/drain regions, and a gate configured to electrically connect the source/drain regions to one another through the channel region), sense amplifiers (e.g., equalization (EQ) amplifiers, isolation (ISO) amplifiers, NMOS sense amplifiers (NSAs), PMOS sense amplifiers (PSAs)), charge pumps (e.g., $V_{CCP}$ charge pumps, $V_{NEWWL}$ charge pumps, DVC2 charge pumps), delay-locked loop (DLL) circuitry (e.g., ring oscillators), drain supply voltage ($V_{dd}$) regulators, decoders, (e.g., column decoders, row decoders), word line (WL) drivers, repair circuitry (e.g., column repair circuitry, row repair circuitry), I/O devices (e.g., local I/O devices), test devices, array multiplexers (MUX), error checking and correction (ECC) devices, self-refresh/wear leveling devices, and various control circuitry. In addition, although FIG. 2A through FIG. 2H do not illustrate the array region, it will be understood that the semiconductor device 200 includes an array region including memory cells (e.g., transistors and capacitor structures, as described above with reference to FIG. 1B).

Conductive landing pads 214 may overlie the base material 202. The conductive landing pads 214 may be substantially the same as the conductive landing pads 114 described above with reference to FIG. 1A. The conductive landing pads 214 may comprise an electrically conductive material. By way of non-limiting example, the conductive landing pads 214 may comprise tungsten.

Figure 2B:
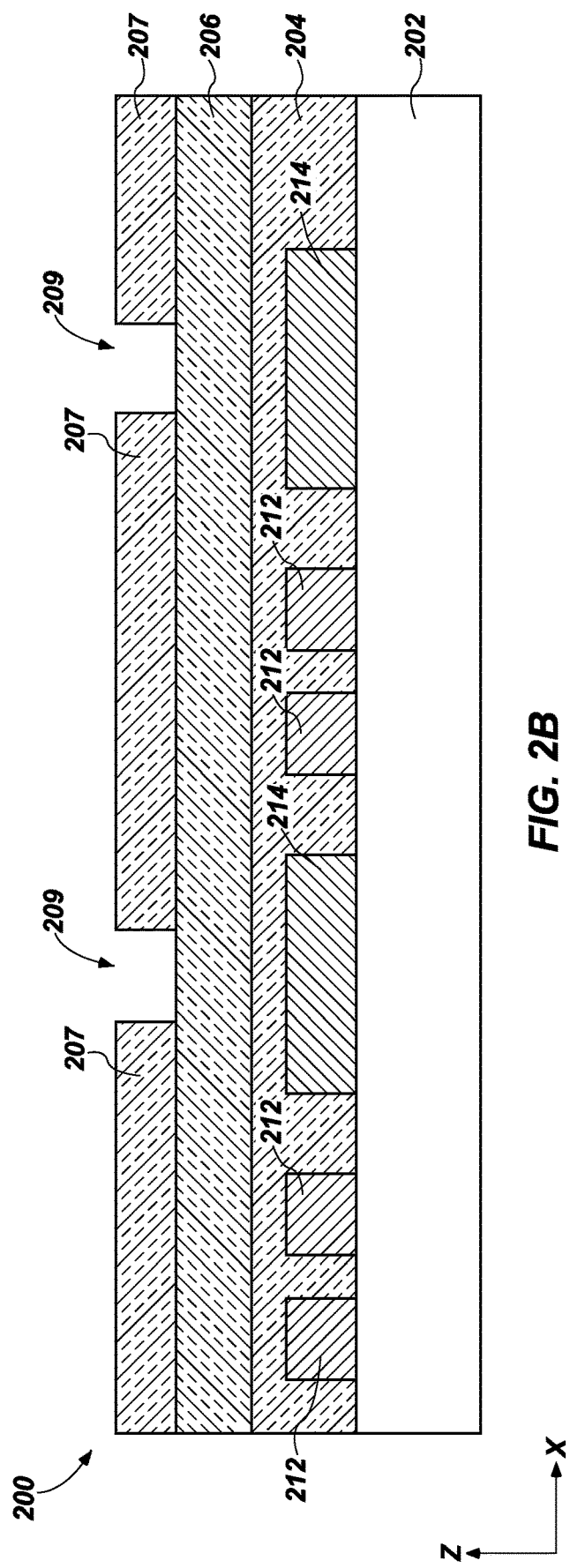

With reference to FIG. 2B, a nitride material 204 may be formed over the conductive lines 212 and the conductive landing pads 214 and in locations between adjacent conductive lines 212 and the conductive landing pads 214. In some embodiments, the nitride material 204 may extend beyond an upper surface of the conductive landing pads 214 and the conductive lines 212. The nitride material 204 may include the same materials described above with reference to the nitride material 104. In some embodiments, the nitride material 204 comprises silicon nitride.

The nitride material 204 may be formed by for example, atomic layer deposition (ALD), chemical vapor deposition (CVD), physical vapor deposition (PVD), plasma-enhanced chemical vapor deposition (PECVD), low pressure chemical vapor deposition (LPCVD), another deposition process, or combinations thereof.

A dielectric material 206 may be formed over the nitride material 204. The dielectric material 206 may exhibit an etch selectivity with respect to the nitride material 204. Stated another way, responsive to exposure to one or more etchants, one of the nitride material 204 or the dielectric material 206 may be not substantially removed while the other of the nitride material 204 or the dielectric material 206 is removed. The dielectric material 206 may include the same materials described above with reference to the dielectric material 106. In some embodiments, the dielectric material 206 comprises silicon dioxide. The dielectric material 206 may be formed by ALD, CVD, PVD, PECVD, LPCVD, another deposition process, or combinations thereof.

A resist material 207 may be formed over the dielectric material 206. The resist material 207 may include, for example, a photoresist material and may comprise a positive tone photoresist material or a negative tone photoresist material. In some embodiments, the resist material 207 comprises a positive tone photoresist material. In additional embodiments, the resist material 207 may comprise, for example, one or more of carbon, silicon oxynitride, and another material.

With continued reference to FIG. 2B, openings 209 may be formed in the resist material 207. The openings 209 may be located over and at least partially laterally aligned with the conductive landing pads 214. By way of non-limiting example, portions of the resist material 207 to be removed (to form the openings 209) may be exposed to light. Following exposure to light, the resist material 207 may be exposed to a developer to remove portions of the resist material 207 exposed to the light and form the openings 209. Portions of the dielectric material 206 may be exposed through the openings 209.

FIG. 2C is a cross-sectional view of the semiconductor device 200 after removing portions of the dielectric material 206 and the nitride material 204 to expose portions of the conductive landing pads 214. After the portions of the dielectric material 206 and the nitride material 204 are removed, the resist material 207 may be removed.

In some embodiments, the dielectric material 206 is removed by exposing the semiconductor device 200 to a plasma comprising $CF_4$, $CHF_3$, $CH_2F_2$, $C_2F_6$, $C_3F_6$, $C_4F_8$, $H_2$, $SF_6$, another etchant, or combinations thereof. The dielectric material 206 may be removed by, for example, reactive ion etching (RIE). In some embodiments, the dielectric material 206 may be removed by a wet etch chemistry, such as hydrofluoric acid (HF), a mixture of hydrofluoric acid and ammonium fluoride ($NH_4F$) (which mixture may be referred to as a buffered oxide etch), hydrochloric acid (HCl), another etchant, or combinations thereof.

The nitride material 204 may be removed by exposing the semiconductor device 200 to, for example, a reactive ion etching process including a gas comprising $CHF_3$, $CH_4$, $CF_4$, $SiF_4$, $SF_6$, $C_2H_2$, $C_2F_6$, $C_2H_4$, $C_3F_8$, $NF_3$, $O_2$, $H_2$, another material, or combinations thereof. By way of non-limiting example, the nitride material 204 may be removed by exposing the semiconductor device 200 to a gas mixture comprising $CF_4/O_2$, $CF_4/O_2/N_2$, $SF_6/O_2/N_2$, $SF_6/CH_4/N_2$, or $SF_6/CH_4/N_2/O_2$, although the disclosure is not so limited. The nitride material 204 may be removed by, for example, RIE.

Although FIG. 2C illustrates that the openings 209 are laterally centered with respect to the conductive landing pads 214, the disclosure is not so limited. In some embodiments, openings 209 may be laterally offset with respect to the contact landing pads 214.

FIG. 2D illustrates the semiconductor device 200 after forming an electrically conductive material 216 in the openings 209 (FIG. 2C) to form contact plugs 216. The contact plugs 216 may be substantially the same as the contact plugs 116 described above with reference to FIG. 1A. In some embodiments, the contact plugs 216 comprise tungsten.

After forming the contact plugs 216, the semiconductor device 200 may be exposed to a chemical mechanical planarization (CMP) process to remove electrically conductive material from surfaces of the semiconductor device 200 and expose the dielectric material 206. In other embodiments, electrically conductive material is removed from surfaces of the semiconductor device 200 by exposing the semiconductor to a dry etch, such as a dry etch gas comprising, for example, $SF_6$, $O_2$, $BCl_3$, another gas, or combinations thereof.

Figure 2E:
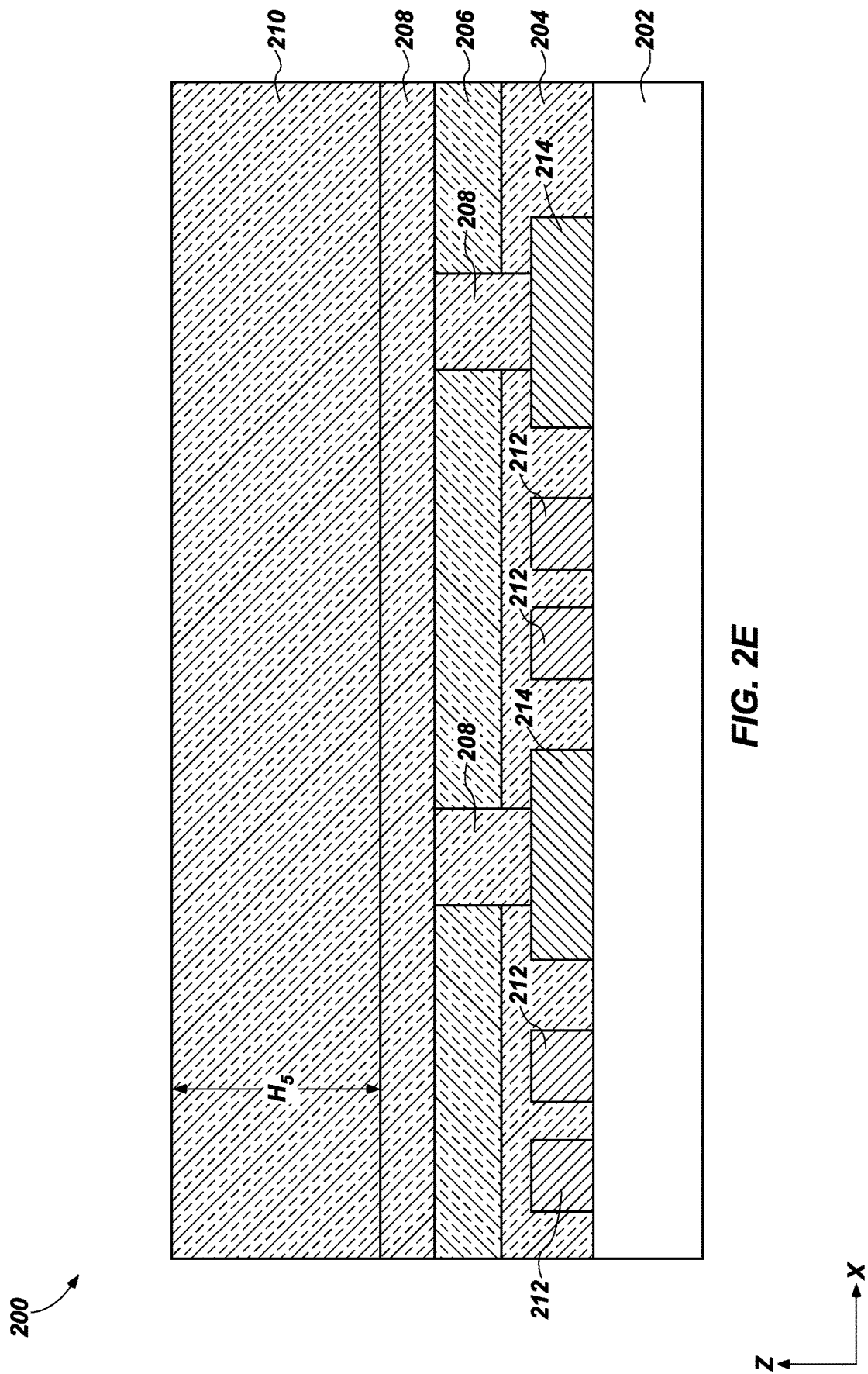

FIG. 2E is a simplified cross-sectional view of the semiconductor device 200 after forming another nitride material 208 over the dielectric material 206 and another dielectric material 210 over the other nitride material 208. In some embodiments, the other nitride material 208 exhibits etch selectivity with respect to the dielectric material 206 and the other dielectric material 210. The other nitride material 208 and the other dielectric material 210 may be substantially the same as the other nitride material 108 and the other dielectric material 110, respectively, described above.

In some embodiments, the other nitride material 208 comprises silicon nitride. The other nitride material 208 may have the same material composition as the nitride material 204. The other dielectric material 210 may comprise silicon dioxide. In some embodiments, the other dielectric material 210 comprises the same material composition as the dielectric material 206.

The other dielectric material 210 may have a height $H_5$ within a range of from about 500 nm to about 2,000 nm, such as from about 500 nm to about 750 nm, from about 750 nm to about 1,000 nm, from about 1,000 nm to about 1,500, or from about 1,500 nm to about 2,000 nm. In some embodiments, the height $H_5$ is about 1,000 nm. As will be described herein, an aspect ratio of a global interconnect structure formed through the other dielectric material 210 may depend on the height $H_5$.

In some embodiments, after forming the other nitride material 208 and the other dielectric material 210, capacitor structures may be formed within an array region of the semiconductor device 200. In some embodiments, the other nitride material 208 and the other dielectric material 210 are masked in the peripheral region during formation of the capacitor structures in the array region.

Figure 2F:
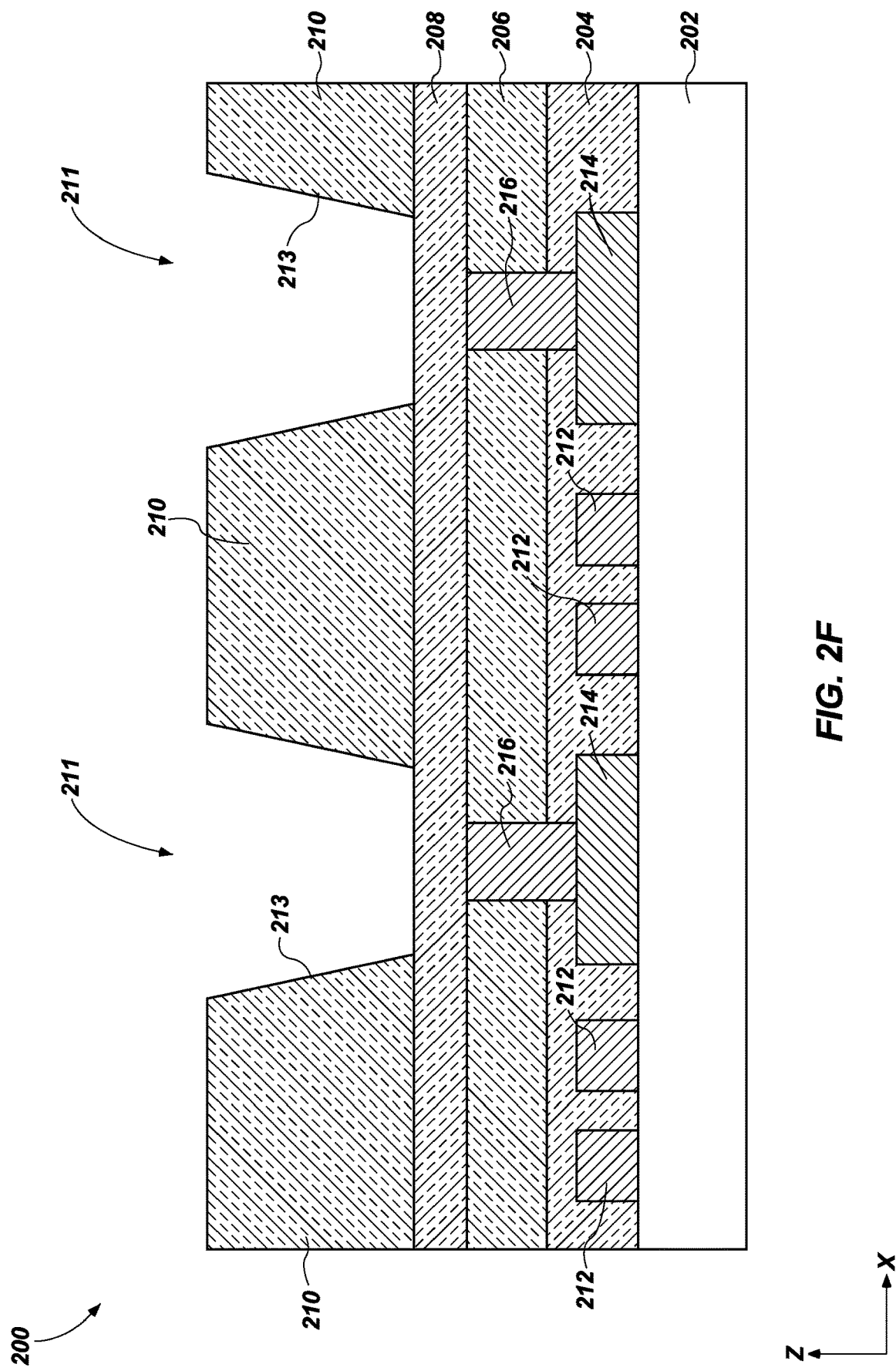

In some embodiments, after forming capacitor structures in the array region, openings 211 are formed in the other dielectric material 210 to expose portions of the other nitride material 208, as illustrated in FIG. 2F. The openings 211 may be formed by exposing the semiconductor device 200 to one or more etchants as described above with respect to removal of the dielectric material 206. By way of non-limiting example, the openings 211 may be formed by exposing the semiconductor device 200 to a plasma comprising $CF_4$, $CHF_3$, $CH_2F_2$, $C_2F_6$, $C_3F_6$, $C_4F_8$, $H_2$, $SF_6$, another etchant, or combinations thereof in, for example, an RIE process.

In some embodiments, due to the height $H_5$ (FIG. 2E) of the other dielectric material 210, sidewalls 213 of the openings 211 may be tapered (angled) with respect to a vertical direction (e.g., the z-direction). However, in other embodiments, the sidewalls 213 may be substantially vertically oriented.

Figure 2G:
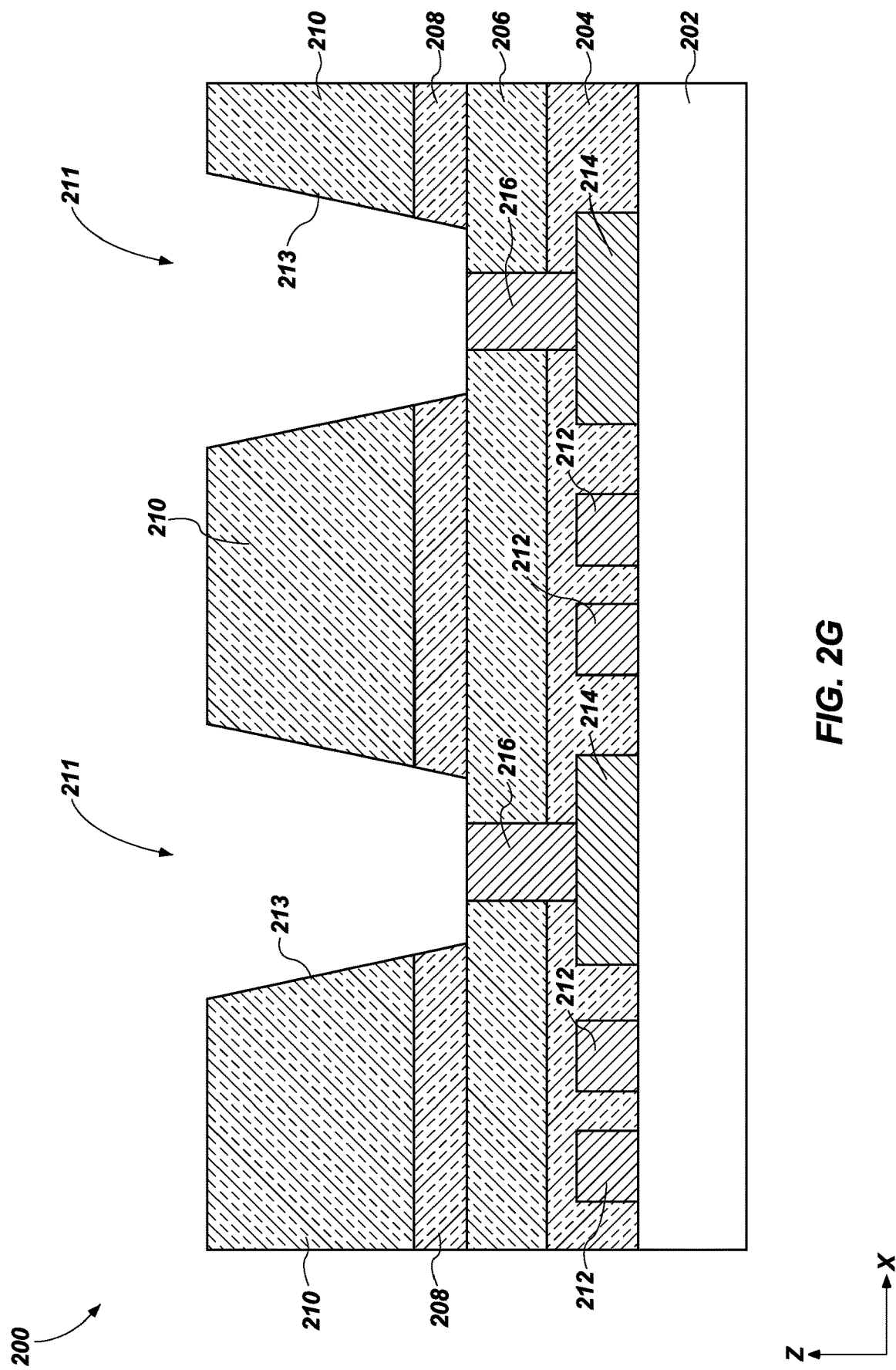

Referring to FIG. 2G, portions of the other nitride material 208 may be removed through the openings 211 to expose portions of the contact plugs 216. The other nitride material 208 may be removed by exposing the semiconductor device 200 to one or more etchants as described above with respect to removal of the nitride material 204. In some embodiments, the material used to remove the other nitride material 208 may be formulated and configured to selectively remove the other nitride material 208 relative to the dielectric material 206 and the other dielectric material 210. Accordingly, removal of the other nitride material 208 may not substantially remove the dielectric material 206 or the other dielectric material 210. Since the removal of the other nitride material 208 is selective to the dielectric material 206, the removal of the other nitride material 208 may stop on the dielectric material 206.

Figure 2H:
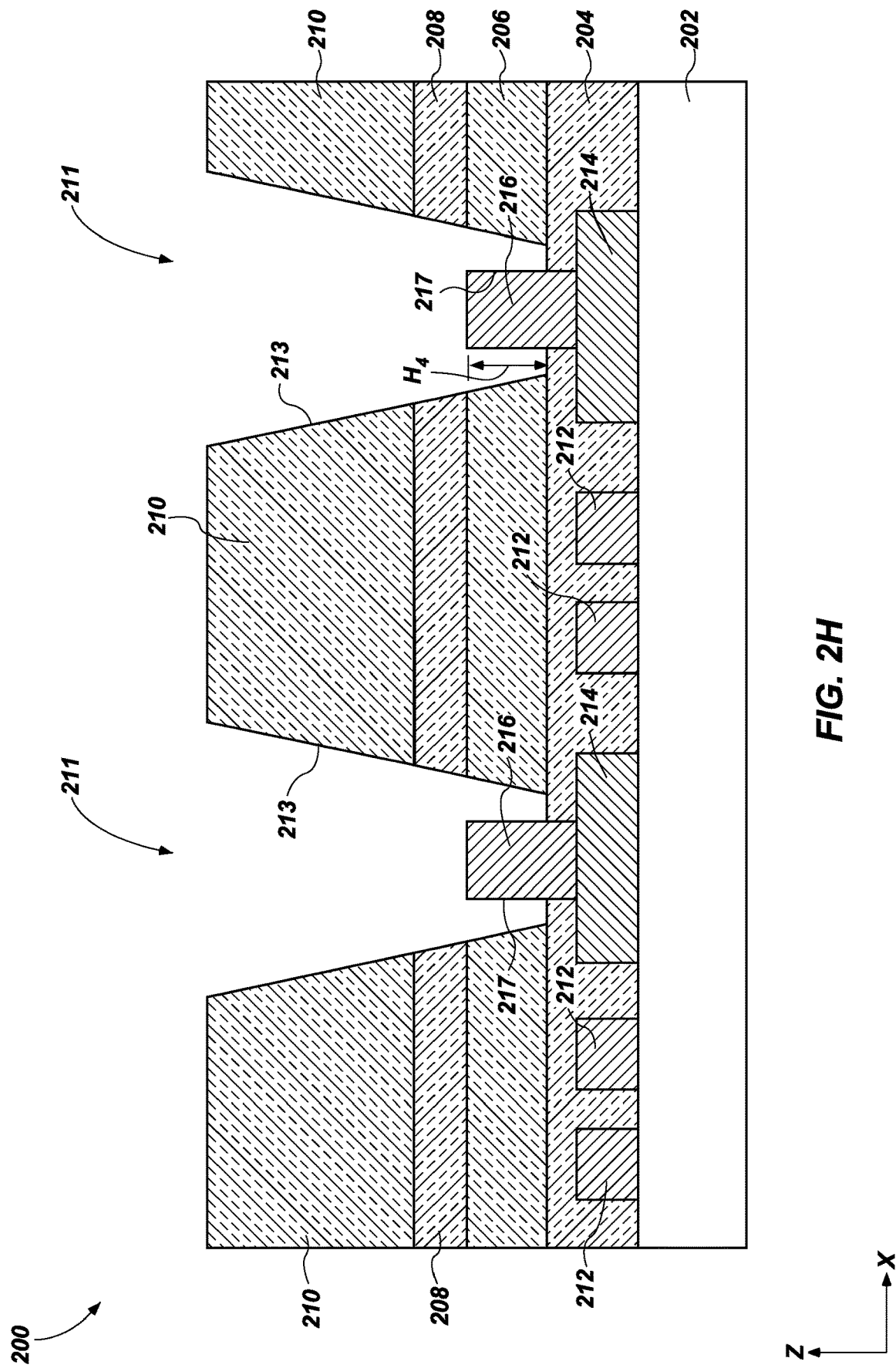

FIG. 2H illustrates the semiconductor device 200 after removing portions of the dielectric material 206 and exposing at least a portion of the sidewalls 217 of the contact plugs 216. The dielectric material 206 may be removed by exposing the semiconductor device 200 to one or more etchants, as described above with reference to removal of the other dielectric material 210. In some embodiments, since the one or more etchants may be formulated and configured to selectively remove the dielectric material 206 with respect to the nitride material 204 and the other nitride material 208, the openings 211 may stop on the nitride material 204. In other words, the removal of the dielectric material 206 may not substantially remove the nitride material 204.

Removal of the portions of the dielectric material 206 may expose the height $H_4$ of the contact plugs 216. The openings 211 may be substantially filled with a conductive material, such as tungsten, to form global interconnect contacts 118, as described with reference to FIG. 1A. Accordingly, the global interconnect contacts 118 may be in electrical communication with the conductive landing pads 214 through the contact plugs 216. The global interconnect contacts 118 may substantially surround the sidewalls 217 of the contact plugs 216 and an upper surface thereof. Since the global interconnect contacts 118 substantially surround the sidewalls 217 of the contact plugs 216 and the upper portions thereof, an electrical contact resistance between the contact plugs 216 and the global interconnect contacts 118 may be reduced compared to conventionally formed interconnects over landing pads.

Without wishing to be bound by any particular theory, it is believed that since the removal of the dielectric material 206 does not substantially remove the nitride material 204 and since interfaces between the conductive landing pads 214 and the contact plugs 216 are not exposed during removal of portions of the dielectric material 206 and during subsequent processing acts, the contact between the conductive landing pads 214 and the contact plugs 216 may not be damaged. It is believed that since the dielectric material 206 is removed without substantially removing the nitride material 204, voids are not created along lower sides of the contact plugs or along sides of the contact landing pads 214. Accordingly, during subsequent processing acts, since there are no voids, the contact plugs 216 and the contact landing pads 214 are not exposed to various chemistries (e.g., wet etchants, cleaning solutions, moisture) that may otherwise damage such structures. In addition, an interface between the contact landing pads 214 and the contact plugs 216 is not exposed to different etchants and material removal chemistries. Accordingly, the electrical continuity between the contact landing pads 214 and the contact plugs 216 may be improved compared to conventional devices. By way of comparison, during formation of conventional semiconductor devices, formation of a contact on a contact landing pad often includes forming openings through a nitride material to expose the contact landing pad. Removal of the nitride material may directly expose an interface between the conductive landing pad and an interconnect structure.

In addition, without wishing to be bound by any particular theory, it is believed that since the contact plugs 216 are formed to have a relatively small aspect ratio and are formed directly on the conductive landing pads 214, the conductive interconnect structure 150 (FIG. 1A) may be less prone to failure compared to conventionally formed semiconductor devices. For example, formation of global interconnects in conventional semiconductor devices includes formation of high aspect ratio openings through, for example, a single dielectric material. However, formation of the high aspect ratio opening through the dielectric material may also undesirably remove insulative material adjacent to the conductive landing pad and below the conductive landing pad, such as an active area and active regions of the semiconductor device (e.g., conductive gates, gate electrodes, drain regions, source regions). In addition, since the contact plugs 216 are formed to have a relatively low aspect ratio, the conductive landing pads 214 may be formed to have a smaller width than in conventionally fabricated semiconductor devices. The smaller width of the conductive landing pads 214 may relax pitch constraints for the conductive lines 212. Therefore, the conductive lines 212 may be formed without performing pitch quad or reverse pitch quad techniques. Since the global interconnect contact 118 substantially wraps around the contact plugs 216, a contact area between the global interconnect contact 118 and the contact plugs 216 is increased and a contact resistance of the conductive interconnect structures 150 is reduced. In addition since the contact plugs 216 are contacted by the global interconnect contact 118 at least at sidewalls and an upper surface of the contact plugs 216, a contact area between the contact plugs 216 and the global interconnect contact 118 may be increased relative to conventional conductive interconnect structures. Accordingly, the contact may exhibit a reduced amount of current crowding and a reduced contact resistance, even though the conductive landing pads 214 may have a reduced width $W_1$ relative to conventional conductive landing pads.

Figure 3C:
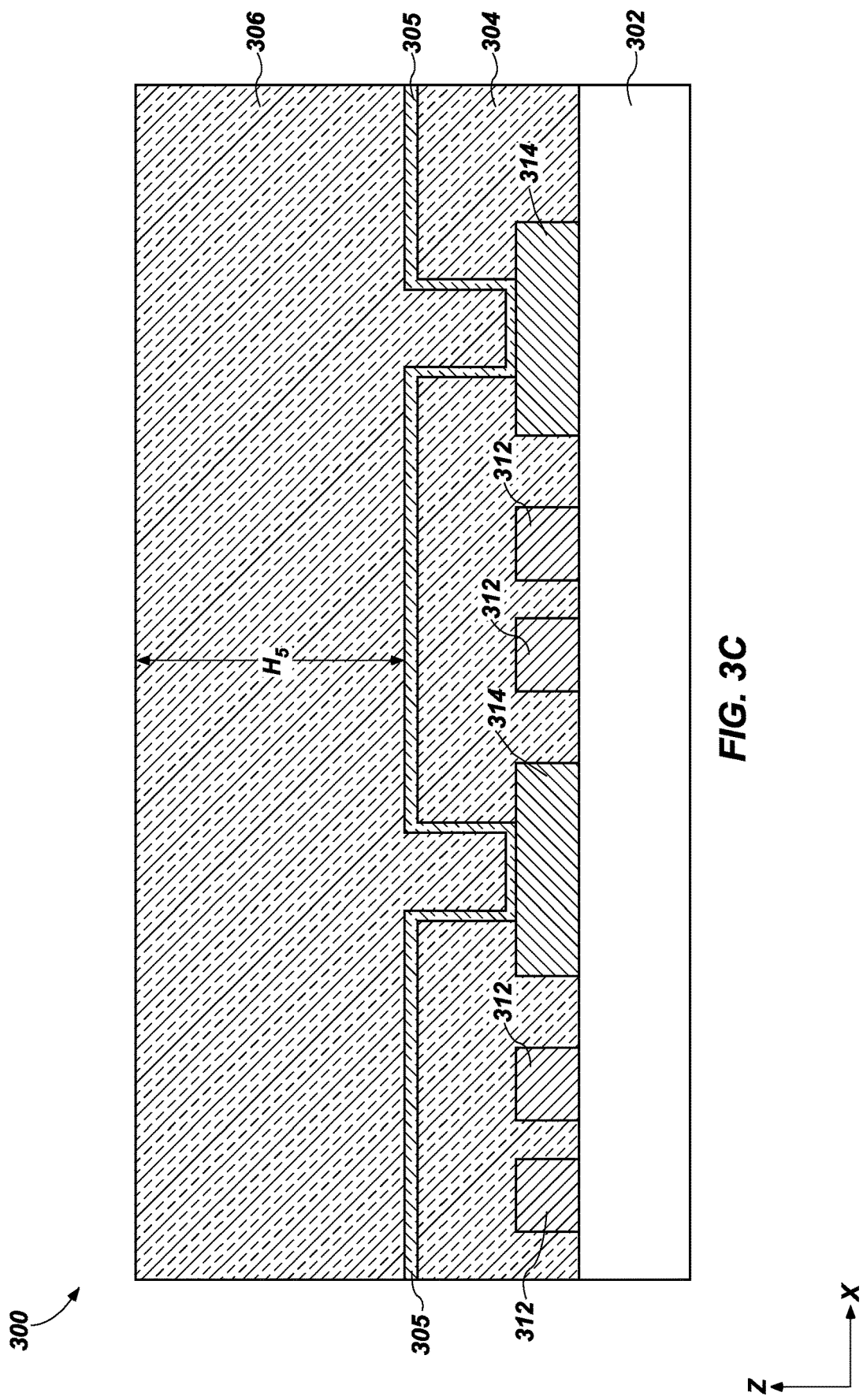

FIG. 3A through FIG. 3F illustrate a method of forming a semiconductor device, in accordance with additional embodiments of the disclosure. Referring to FIG. 3A, a semiconductor device 300 includes a base material 302 and a pattern of conductive lines 312 and conductive landing pads 314 over the base material 302. The base material 302, the conductive lines 312, and the conductive landing pads 314 may be substantially the same as the base material 202, the conductive lines 212, and the conductive landing pads 214, respectively, described above with reference to FIG. 2A through FIG. 2H.

A nitride material 304 may be formed over the base material 302, the conductive lines 312, and the conductive landing pads 314. The nitride material 304 may be located laterally between adjacent conductive lines 312 and conductive landing pads 314. In some embodiments, the nitride material 304 may overlie an upper surface of the conductive lines 312 and the conductive landing pads 314.

The nitride material 304 may be substantially the same as the nitride material 204 described above with reference to FIG. 2B through FIG. 2H. In some embodiments, the nitride material 204 comprises silicon nitride.

Openings 309 may be formed in the nitride material 304 to expose at least a portion of the conductive landing pads 314. The openings 309 may be formed by, for example, forming and patterning a resist material over the nitride material 304, and removing portions of the nitride material 304 through the patterned resist material to form the openings 309.

FIG. 3B illustrates the semiconductor device 300 after forming a liner material 305 over the semiconductor device 300 and within the openings 309. In some embodiments, the liner material 305 is formed conformally over the semiconductor device 300. The liner material 305 may comprise a dielectric material, such as, for example, silicon nitride, silicon dioxide, $Al_2O_3$, phosphosilicate glass, borosilicate glass, borophosphosilicate glass, fluorosilicate glass, or combinations thereof. In some embodiments, the liner material 305 comprises silicon nitride. The liner material 305 may comprise the same material as the nitride material 304.

A thickness $T_1$ of the liner material 305 may be within a range of from about 5 nm to about 20 nm, such as from about 5 nm to about 10 nm, from about 10 nm to about 15 nm, or from about 15 nm to about 20 nm.

With reference to FIG. 3C, a dielectric material 306 may be formed over the liner material 305 and may substantially completely fill the openings 309. The dielectric material 306 may be substantially the same as the dielectric material 206 described above with reference to FIG. 2B through FIG. 2H. In some embodiments, the dielectric material 306 comprises silicon dioxide.

A height $H_5$ of the dielectric material 306 may be the same as the height $H_5$ of the dielectric material 206 described above with reference to FIG. 2E.

Figure 3D:
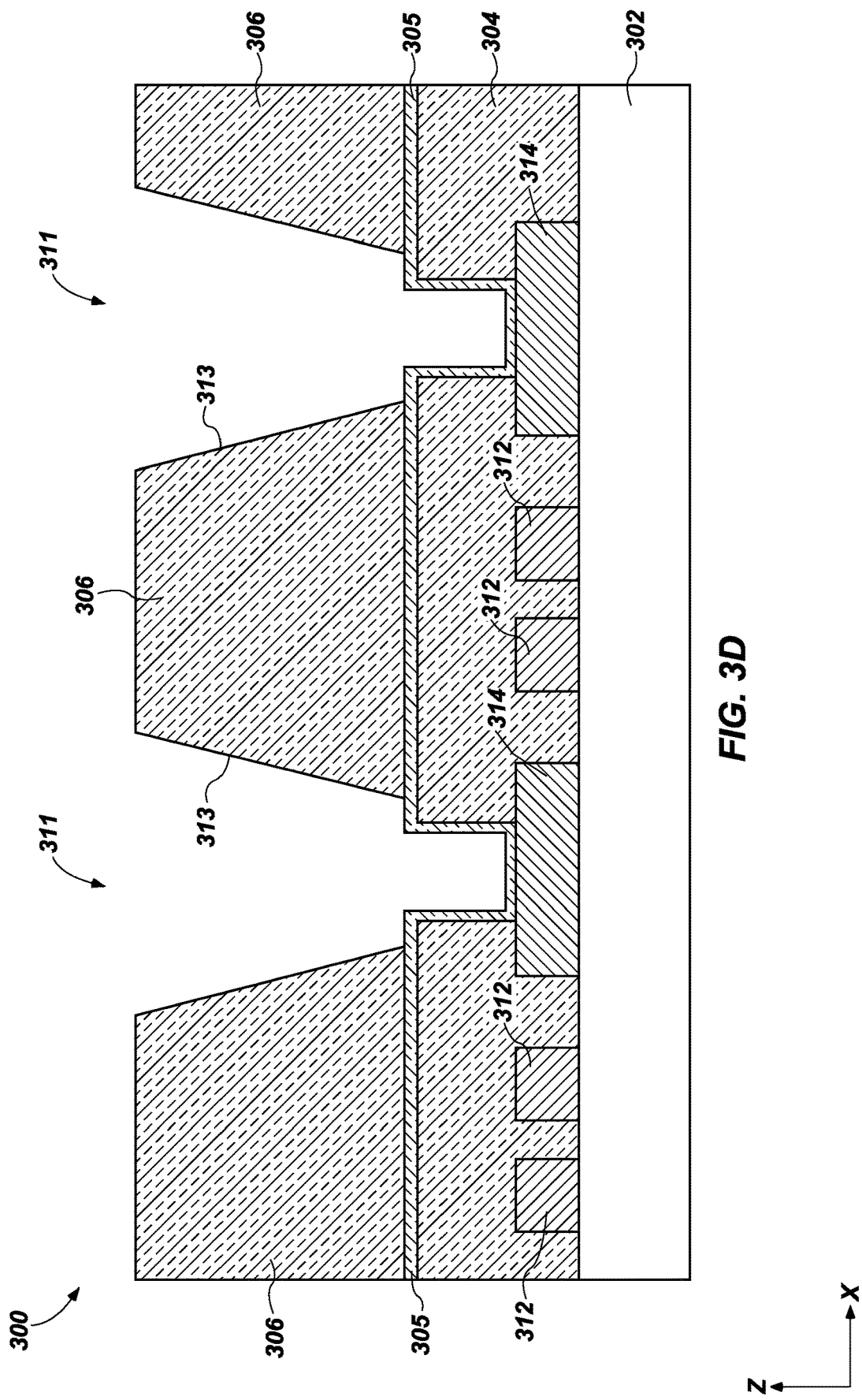

Referring to FIG. 3D, openings 311 may be formed in the dielectric material 306 to expose the liner material 305. Portions of the dielectric material 306 may be removed by exposing the semiconductor device 300 to, for example, a dry etchant including a plasma comprising $CF_4$, $CHF_3$, $CH_2F_2$, $C_2F_6$, $C_3F_6$, $C_4F_8$, $H_2$, $SF_6$, another etchant, or combinations thereof, as described above with reference to FIG. 2C and removal of the dielectric material 206. The material used to remove the dielectric material 306 may be formulated and configured to selectively remove the dielectric material 306 relative to the liner material 305. Accordingly, the openings 311 may extend to the liner material 305.

In some embodiments, due to the height $H^5$ (FIG. 3C) of the dielectric material 306, sidewalls 313 of the openings 311 may be tapered (angled) with respect to a vertical direction (e.g., the z-direction).

Figure 3E:
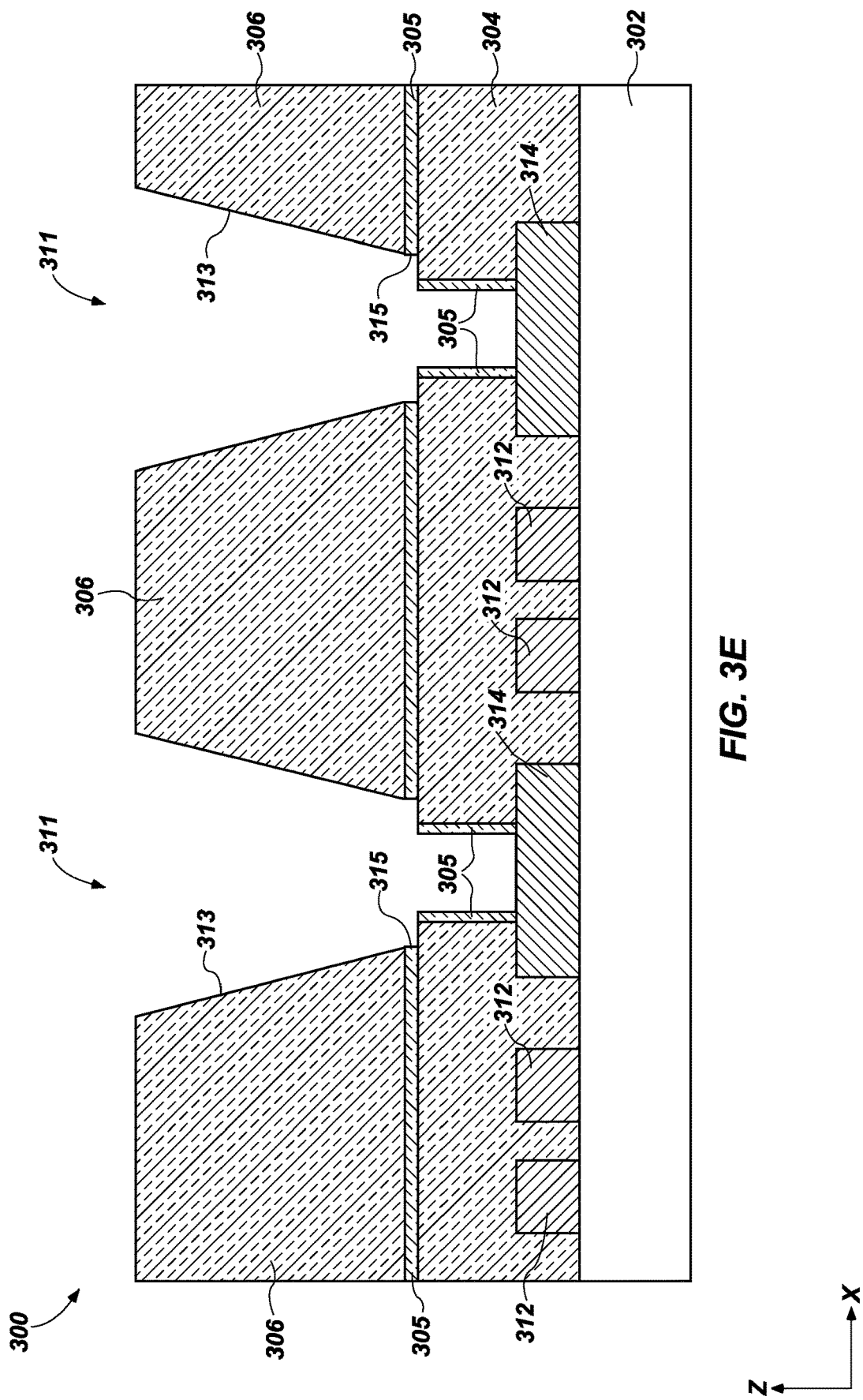

FIG. 3E illustrates the semiconductor device 300 after removing laterally extending portions of the liner material 305 and exposing portions of the conductive landing pads 314. The liner material 305 may be removed by exposing the semiconductor device 300 to one or more chemistries formulated and configured to remove the liner material 305 without substantially removing the dielectric material 306. For example, the semiconductor device 300 may be exposed to one or more chemistries described above with reference to removal of the nitride material 204 (FIG. 2C) to remove the liner material 305.

Portions of the liner material 305 may remain on sidewalls of the nitride material 304 within the opening 311. Removal of the liner material 305 may leave substantially vertical sides 315 extending from a lower surface of the dielectric material 306 to an upper surface of the liner material 305.

Figure 3F:
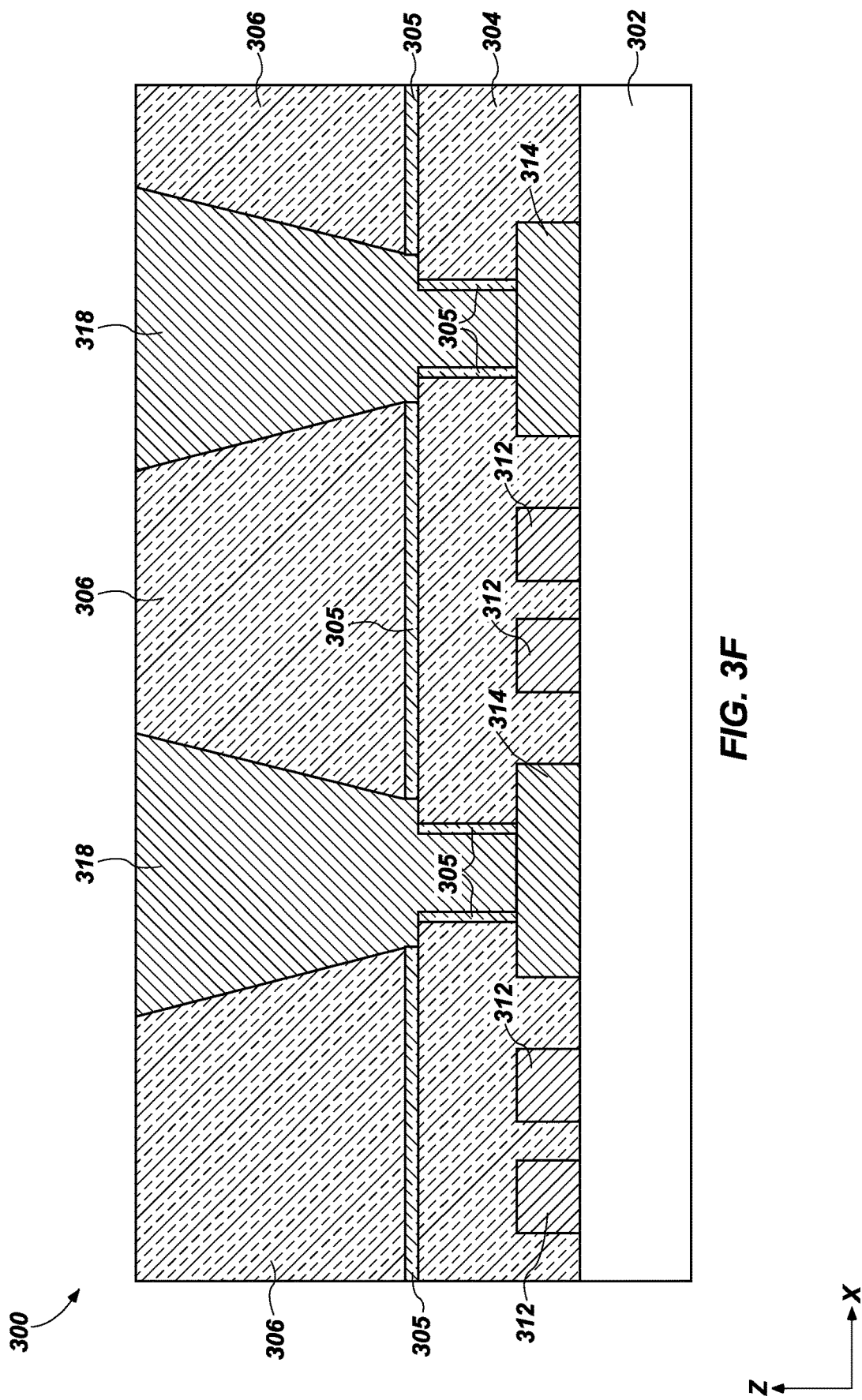

Referring to FIG. 3F, the openings 311 (FIG. 3E) may be filled with an electrically conductive material to form global interconnect contacts 318. Electrically conductive material overlying surfaces of the dielectric material 306 may be removed, such as by CMP. In some embodiments, the global interconnect contacts 318 comprise tungsten.

The global interconnect contact 318 may comprise a first portion having substantially vertical sidewalls, which may be lined by the liner material 305. The first portion may have an aspect ratio less than about 10.0:1.0, such as less than about 2.0:1.0. A second portion of the global interconnect contact 318 may be in electrical communication with the first portion. The second portion may have an aspect ratio greater than the first portion, such as an aspect ratio of at least about 40:1. The global interconnect contact 318 may reliably be formed in electrical communication with the conductive landing pad 314 since the global interconnect contact 318 is formed by forming the opening 309 (FIG. 3A) followed by forming the liner material 305 within the opening. Removal of the dielectric material 306 to form the openings 311 may be selective with respect to the liner material 305 and may not substantially remove the liner material 305. After removal of the dielectric material 306, the liner material 305 over surfaces of the conductive landing pads 314 may be selectively removed with respect to the conductive landing pads 314 without substantially removing materials located on sides or under the conductive landing pads 314. Accordingly, even though the global interconnect contacts 318 exhibit a high aspect ratio, they may reliably be formed in contact with the conductive landing pads 314.

The semiconductor device 300 may be further processed, such as by forming capacitor contacts in an array region of the semiconductor device 300, as described above with reference to FIG. 2E. For example, capacitor structures may be formed within an array region of the semiconductor device 300 after forming the dielectric material 306 over the liner material 305.

Figure 4A:
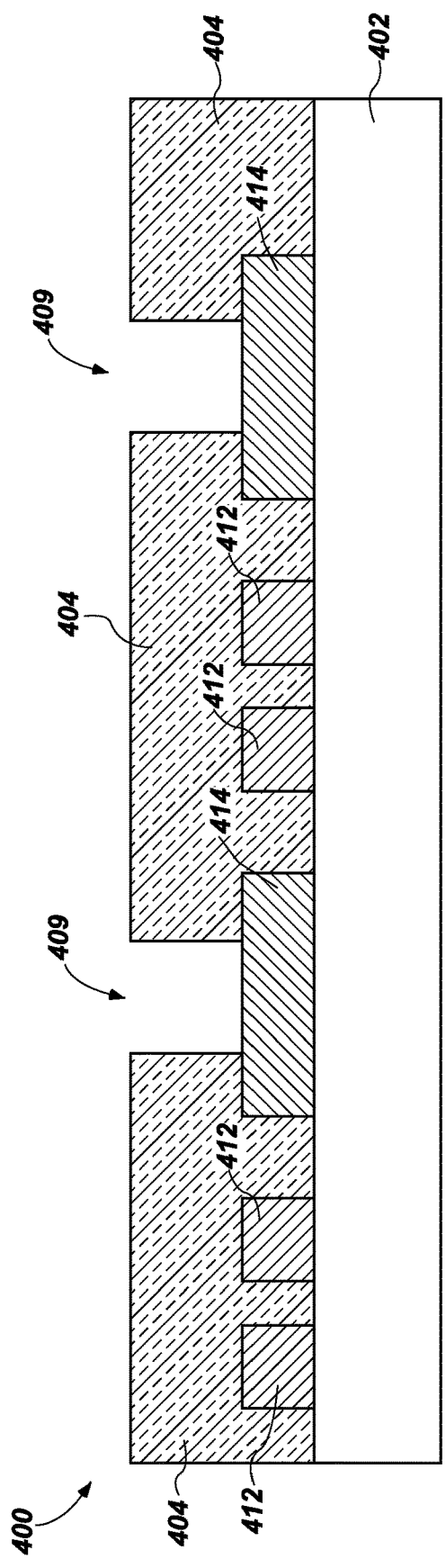
FIG. 4A through FIG. 4F are simplified cross-sectional views illustrating a method of forming a semiconductor device, in accordance with embodiments of the disclosure.

FIG. 4A through FIG. 4F illustrate a method of forming a semiconductor device, in accordance with additional embodiments of the disclosure. FIG. 4A illustrates a semiconductor device 400 including a base material 402 and a pattern of conductive lines 412 and conductive landing pads 414 over the base material 402. The base material 402, the conductive lines 412, and the conductive landing pads 414 may be substantially the same as the base material 202, the conductive lines 412, and the conductive landing pads 214, respectively, described above with reference to FIG. 2A through FIG. 2H.

A nitride material 404 may be formed over the base material 402, the conductive lines 412, and the conductive landing pads 414. The nitride material 404 may be located laterally between adjacent conductive lines 412 and conductive landing pads 414. In some embodiments, the nitride material 404 may overlie upper surfaces of the conductive lines 412 and the conductive landing pads 414. The nitride material 404 may be substantially the same as the nitride material 204 described above with reference to FIG. 2B through FIG. 2H. In some embodiments, the nitride material 404 comprises silicon nitride.

Openings 409 may be formed in the nitride material 404 to expose at least a portion of the conductive landing pads 414. The openings 409 may be formed by, for example, forming and patterning a resist material over the nitride material 404, and removing portions of the nitride material 404 through the patterned resist material to form the openings 409.

Figure 4B:
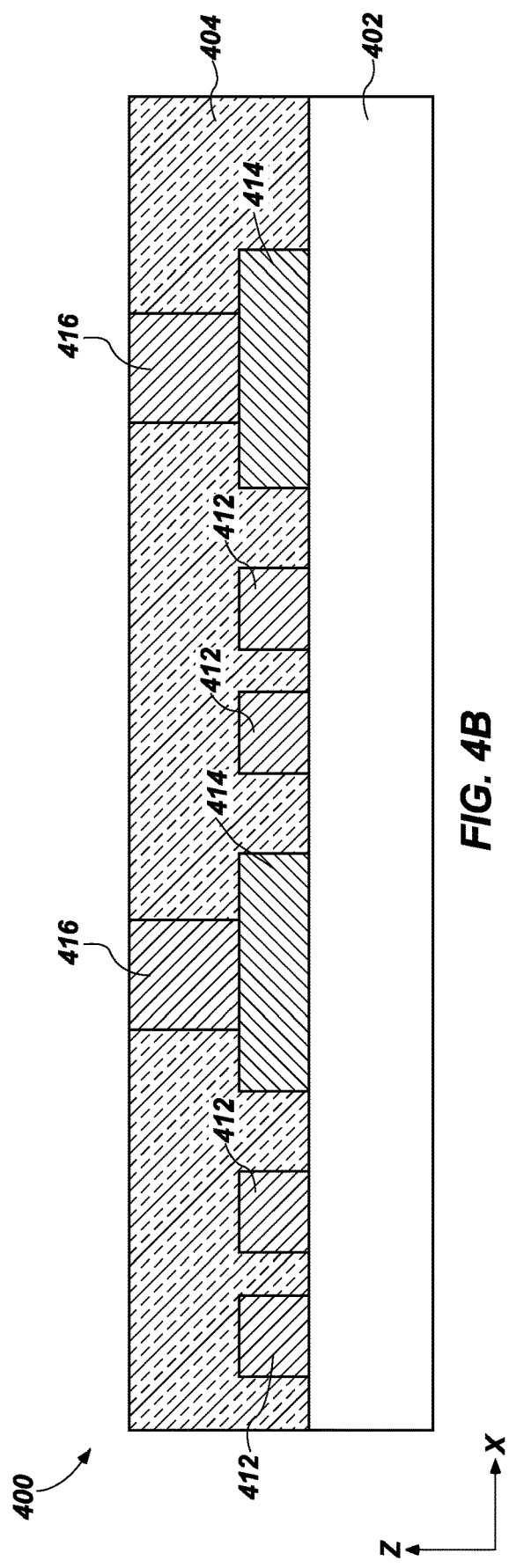

Referring to FIG. 4B, an electrically conductive material may be formed over the semiconductor device 400 to form contact plugs 416 within the openings 409 (FIG. 4A). The electrically conductive material may be formed by ALD, CVD, PVD, PECVD, LPCVD, another deposition process, or combinations thereof. Electrically conductive material remaining over surfaces of the semiconductor device 400 may be removed, such as by CMP. The contact plugs 416 may be in electrical communication with the conductive landing pads 414.

Figure 4C:
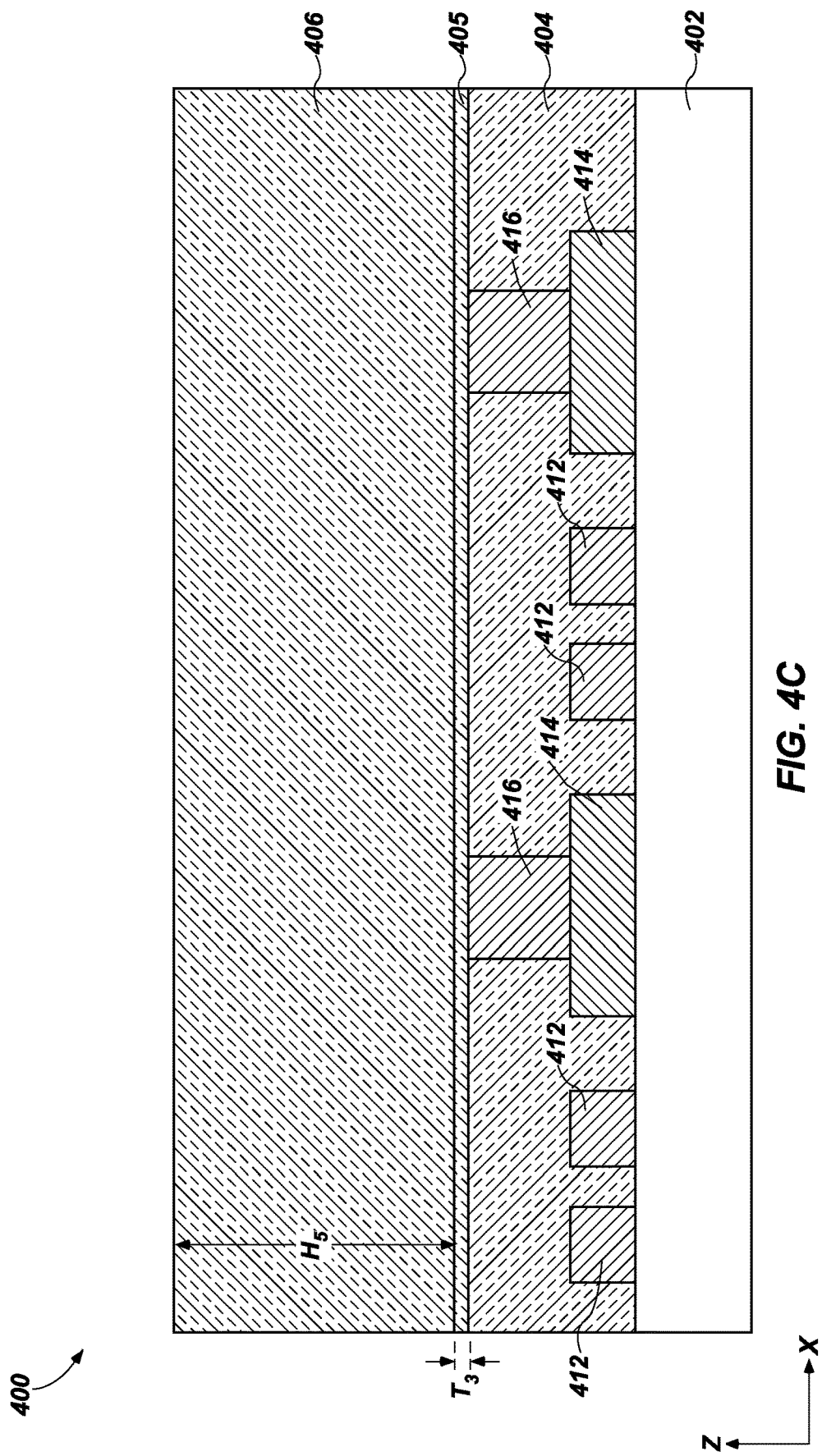

FIG. 4C illustrates the semiconductor device 400 after forming another nitride material 405 over the nitride material 404 and forming a dielectric material 406 over the other nitride material 405. The other nitride material 405 may comprise silicon nitride. In some embodiments, the other nitride material 405 comprises the same material as the nitride material 404. The dielectric material 406 may comprise the same materials described above with reference to the dielectric material 206. In some embodiments, the dielectric material 406 comprises silicon dioxide. The dielectric material 406 may exhibit an etch selectivity with respect to the other nitride material 405 and the nitride material 404.

A height $H_5$ of the dielectric material 406 may be the same as the height $H_5$ of the dielectric material 206 described above with reference to FIG. 2E.

Figure 4D:
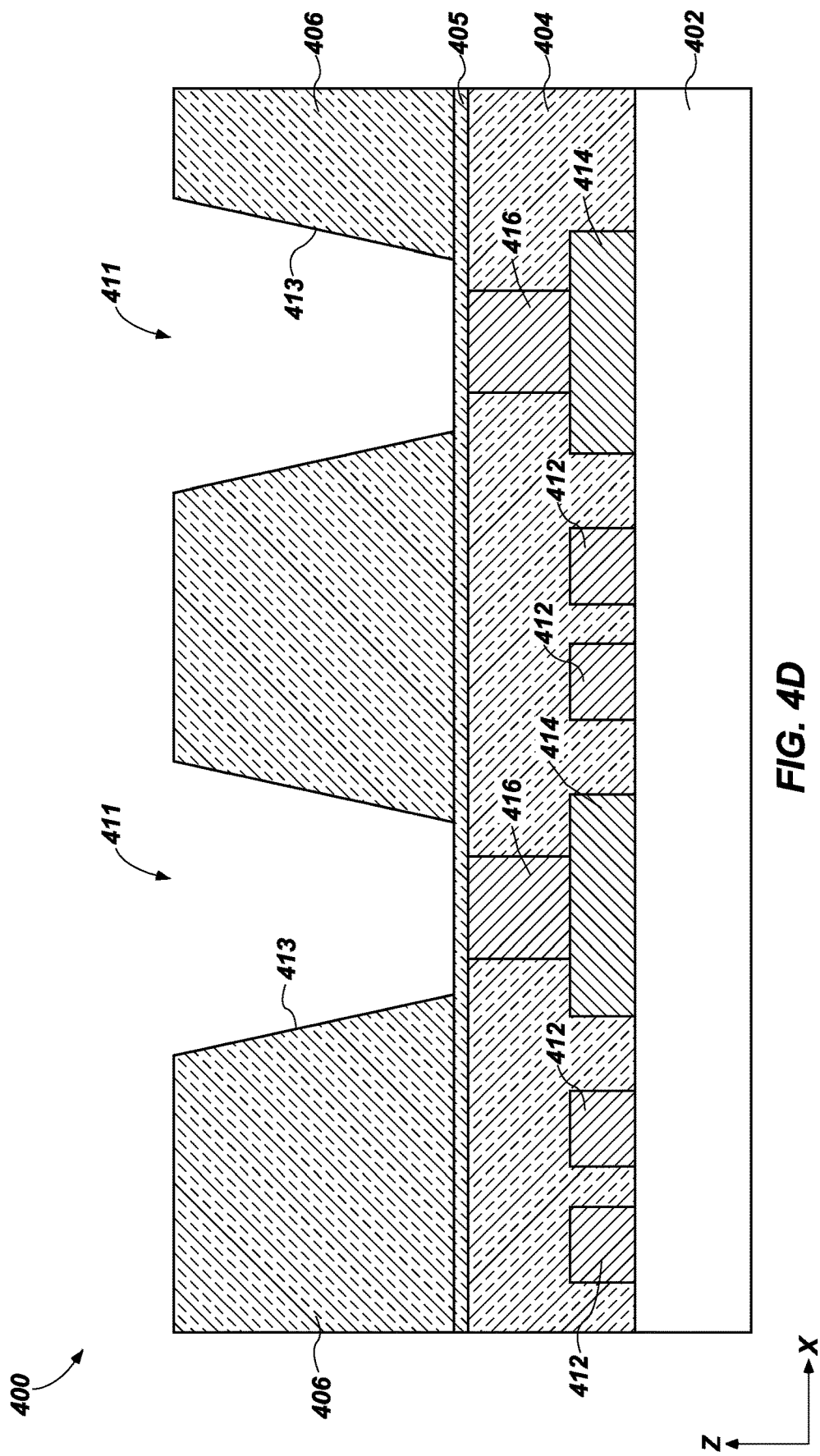

FIG. 4D illustrates the semiconductor device 400 after forming openings 411 in the dielectric material 406 to expose the other nitride material 405. Portions of the dielectric material 406 may be removed by exposing the semiconductor device 400 to, for example, $CF_4$, $CHF_3$, $CH_2F_2$, $C_2F_6$, $C_3F_6$, $C_4F_8$, $H_2$, $SF_6$, another etchant, or combinations thereof, as described above with reference to FIG. 2C and removal of the dielectric material 206. The material used to remove the dielectric material 406 may be formulated and configured to selectively remove the dielectric material 406 relative to the other nitride material 405. Accordingly, the openings 411 may extend to the other nitride material 405.

Sidewalls 413 of the openings 411 may be angled with respect to a vertical direction (e.g., the z-direction). In some embodiments, since an aspect ratio of the openings 411 is large (e.g., greater than about 10:1) the openings 411 may be tapered.

Figure 4E:
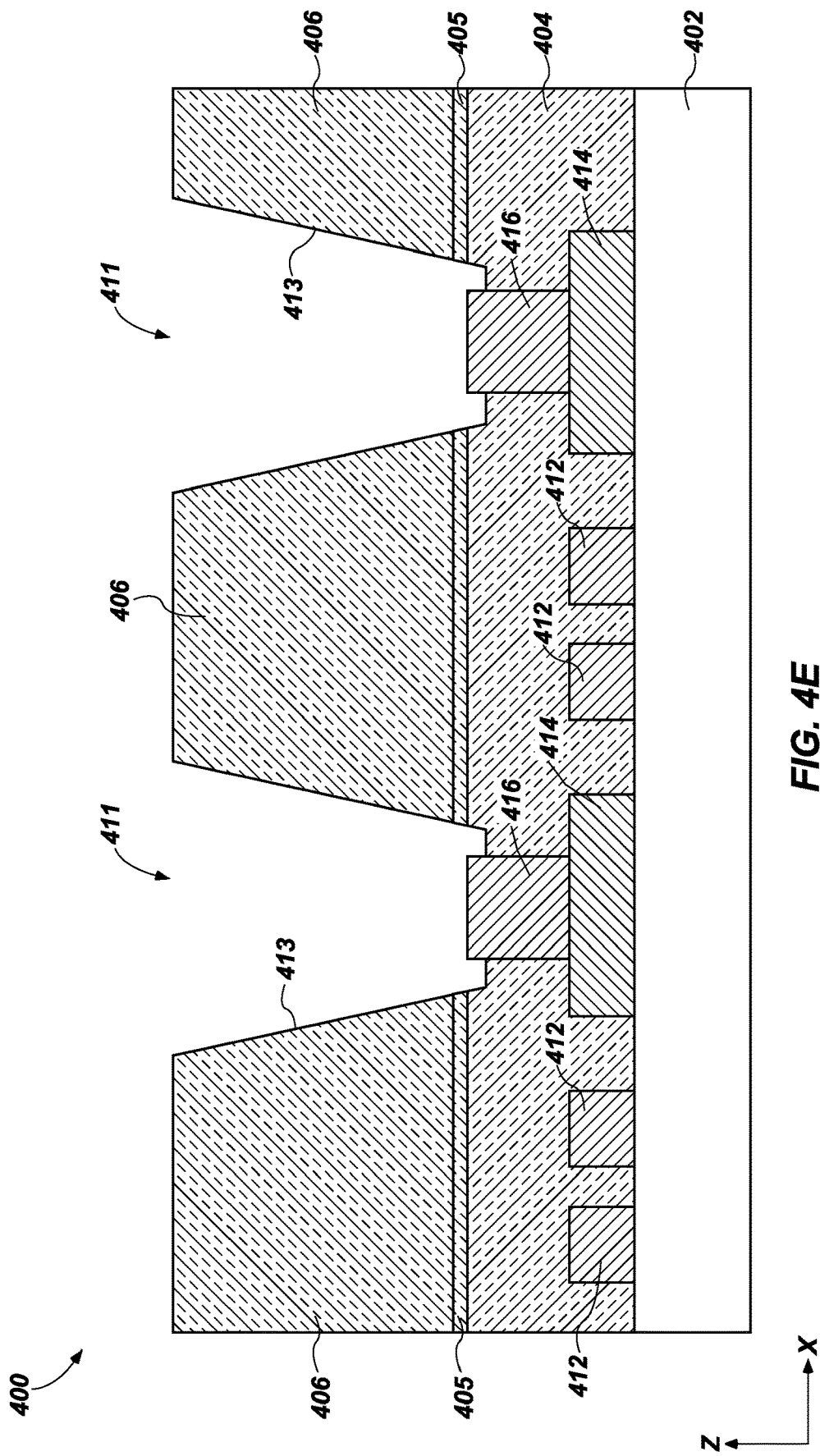

FIG. 4E illustrates the semiconductor device 400 after removing portions of the other nitride material 405 and the nitride material 404 and exposing at least an upper portion of the contact plugs 416. The other nitride material 405 and the nitride material 404 may be removed by exposing the semiconductor device 400 to one or more chemistries formulated and configured to remove the other nitride material 405 and the nitride material 404 without substantially removing the dielectric material 406. For example, the semiconductor device 400 may be exposed to a gas comprising $CHF_3$, $CH_4$, $CF_4$, $SiF_4$, $SF_6$, $C_2H_2$, $C_2F_6$, $C_2H_4$, $C_3F_8$, $NF_3$, $O_2$, $H_2$, another material, and combinations thereof, to remove the other nitride material 405 and the nitride material 404.

Figure 4F:
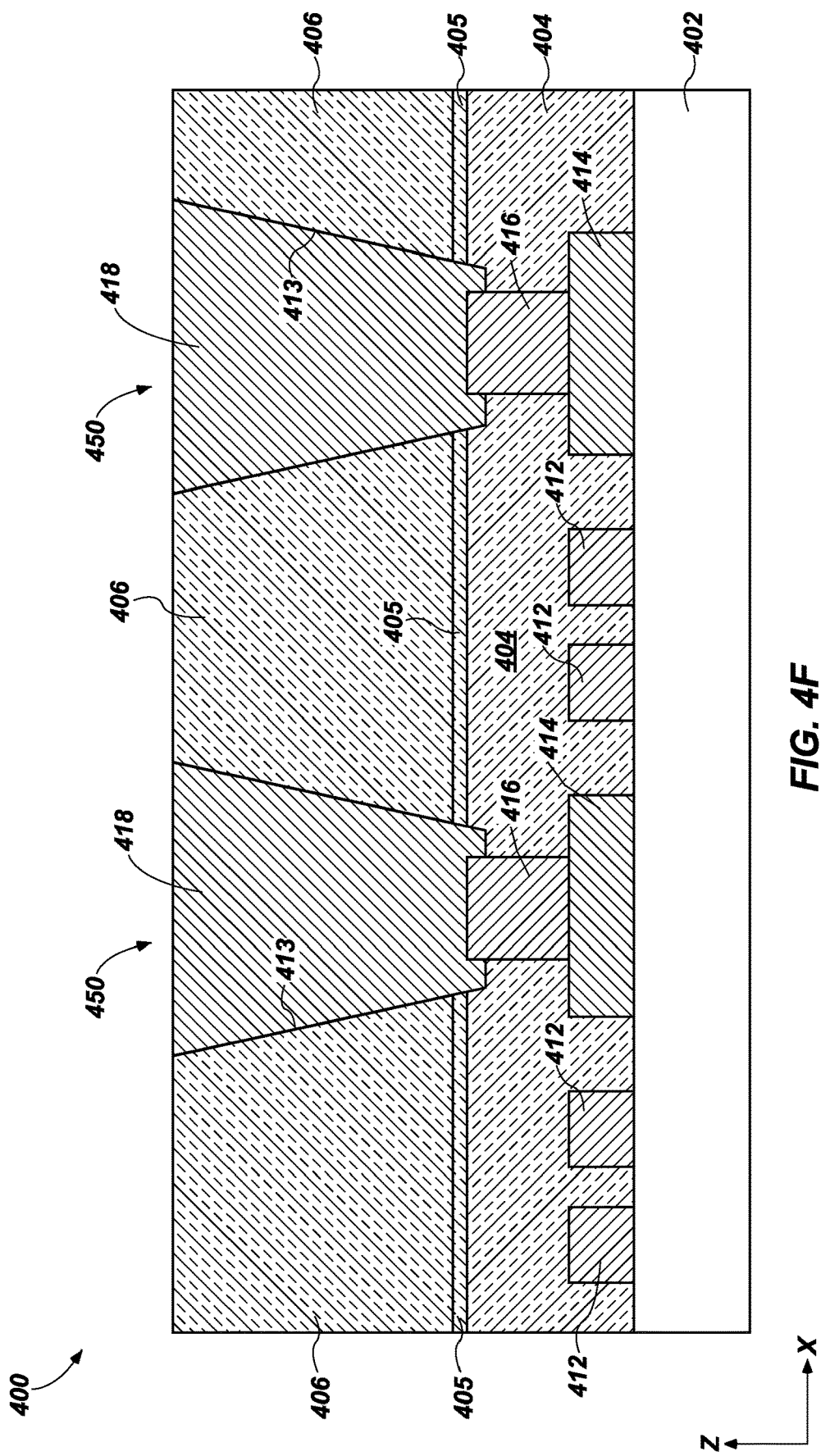

Referring to FIG. 4F, an electrically conductive material may be formed over the semiconductor device to form global interconnect contacts 418 comprising the electrically conductive material. The global interconnect contacts 418 may be in electrical communication with the contact plugs 416. The global interconnect contacts 418 may substantially surround at least a portion of the contact plugs 416. Stated another way, the global interconnect contacts 418 may overlie and contact at least a portion of sidewalls of the contact plugs 416. The global interconnect contacts 418 may comprise an electrically conductive material. In some embodiments, the global interconnect contacts 418 comprise tungsten.

Accordingly, conductive interconnect structures 450 may comprise the contact plugs 416 in electrical communication with the conductive landing pads 414 and the global interconnect contacts 418 in electrical communication with the contact plugs 416. In some embodiments, at least a portion of the sidewalls 413 of the global interconnect contacts 418 include tapered sidewalls while at least a portion of the contact plugs 416 include substantially vertical sidewalls.

With continued reference to FIG. 4F, at least a portion of the contact plugs 416 may extend into the global interconnect contacts 418. Since at least a portion of the contact plugs 416 extend into the global interconnect contacts 418, a contact resistance between the contact plugs 416 and the global interconnect contacts 418 may be reduced.

Thus, in accordance with embodiments of the disclosure, a semiconductor device comprises conductive lines, a conductive landing pad in electrical communication with a conductive line of the conductive lines, and a conductive interconnect structure in electrical communication with the conductive landing pad. The conductive interconnect structure comprises a contact plug in electrical communication with the conductive landing pad, and a global interconnect contact in electrical communication with the contact plug and having a greater lateral width than the contact plug.

Furthermore, in accordance with embodiments of the disclosure, a method of forming a semiconductor device comprises forming a first nitride material over a base material in a region of the semiconductor device, removing at least a portion of the first nitride material to expose at least a portion of a conductive landing pad through an opening, forming a contact plug within the opening and in contact with the conductive landing pad, forming a second nitride material over at least the contact plug, removing a portion of the second nitride material to expose a portion of the contact plug, and forming a global interconnect contact over the exposed portion of the contact plug, the global interconnect structure having an aspect ratio greater than an aspect ratio of the contact plug.

In addition, in accordance with additional embodiments of the disclosure, a method of forming a semiconductor device comprises forming an opening through a nitride material to expose at least a portion of a conducive landing pad, forming a liner material over surfaces of the semiconductor device and within the opening, forming a dielectric material over the liner material, forming an opening through the dielectric material to expose the liner material, removing portions of the liner material and the nitride material to expose a portion of the conductive landing pad, and forming an electrically conductive material over the exposed portion of the conductive landing pad.

Figure 5:
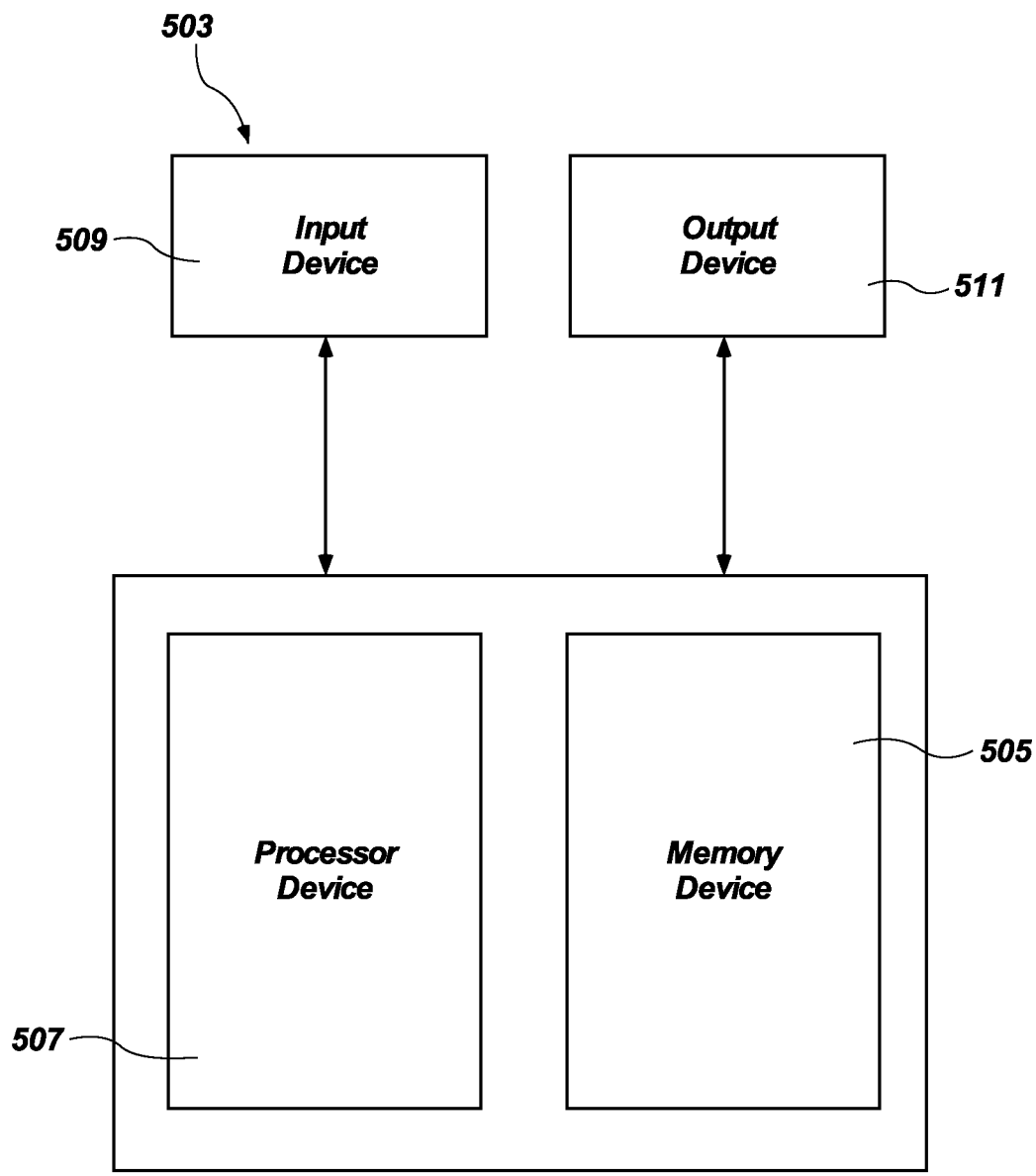
FIG. 5 is a schematic block diagram of an electronic system, in accordance with embodiments of the disclosure.

Semiconductor devices (e.g., the semiconductor device 100, the semiconductor device 200, the semiconductor device 300, the semiconductor device 400) including conductive interconnect structures (e.g., the conductive interconnect structure 150, the conductive interconnect structure 450, the global interconnect contacts 118, the global interconnect contact 318, the global interconnect contact 418) in accordance with embodiments of the disclosure may be used in embodiments of electronic systems of the disclosure. For example, FIG. 5 is a block diagram of an electronic system 503 according to embodiments of disclosure. The electronic system 503 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, or a navigation device. The electronic system 503 includes at least one memory device 505. The memory device 505 may include, for example, an embodiment of a semiconductor device previously described herein (e.g., the semiconductor device 100, the semiconductor device 200, the semiconductor device 300, the semiconductor device 400) including conductive interconnect structures previously described herein (e.g., the conductive interconnect structure 150, the conductive interconnect structure 450, the global interconnect contacts 118, the global interconnect contact 318, the global interconnect contact 418).

The electronic system 503 may further include at least one electronic signal processor device 507 (often referred to as a "microprocessor"). The electronic signal processor device 507 may, optionally, include an embodiment of a semiconductor device previously described herein (e.g., the semiconductor device 100, the semiconductor device 200, the semiconductor device 300, the semiconductor device 400). The electronic system 503 may further include one or more input devices 509 for inputting information into the electronic system 503 by a user, such as, for example, a mouse or other pointing device, a keyboard, a touchpad, a button, or a control panel. The electronic system 503 may further include one or more output devices 511 for outputting information (e.g., visual or audio output) to a user such as, for example, one or more of a monitor, a display, a printer, an audio output jack, and a speaker. In some embodiments, the input device 509 and the output device 511 may comprise a single touchscreen device that can be used both to input information to the electronic system 503 and to output visual information to a user. The input device 509 and the output device 511 may communicate electrically with one or more of the memory device 505 and the electronic signal processor device 507. In some embodiments, more than one function may be performed by a single semiconductor die, for example in the case of a system on a chip (SoC), wherein processor and memory functions are incorporated in a single die.

Thus, in accordance with embodiments of the disclosure, an electronic system comprises at least one processor device operably coupled to at least one input device and at least one output device, a semiconductor device operably coupled to the at least one processor device. The semiconductor device comprises a conductive landing pad, and a conductive interconnect structure in electrical communication with the conductive landing pad, the conductive interconnect structure comprising a first portion directly contacting the conductive landing pad, and a second portion in contact with the first portion, the second portion having a width greater than a width of the first portion and an aspect ratio greater than an aspect ratio the first portion.

While certain illustrative embodiments have been described in connection with the figures, those of ordinary skill in the art will recognize and appreciate that embodiments encompassed by the disclosure are not limited to those embodiments explicitly shown and described herein. Rather, many additions, deletions, and modifications to the embodiments described herein may be made without departing from the scope of embodiments encompassed by the disclosure, such as those hereinafter claimed, including legal equivalents. In addition, features from one disclosed embodiment may be combined with features of another disclosed embodiment while still being encompassed within the scope of the disclosure.

What is claimed is:

1. A device, comprising:
    conductive lines;
    a conductive landing pad in electrical communication with a conductive line of the conductive lines; and
    a conductive interconnect structure in electrical communication with the conductive landing pad, the conductive interconnect structure comprising:
        a contact plug in electrical communication with the conductive landing pad, the contact plug extending through a nitride material, the contact plug having substantially vertical sidewalls; and
        a global interconnect contact in electrical communication with the contact plug and having a greater lateral width than the contact plug, the global interconnect contact having tapered sidewalls.

2. The device of claim 1, wherein a material composition of the contact plug is substantially the same as that of the global interconnect contact.

3. The device of claim 1, wherein the contact plug and the global interconnect contact comprise tungsten.

4. The device of claim 1, wherein the global interconnect contact has a greater lateral width than the contact plug at an interface between the global interconnect contact and the contact plug.

5. The device of claim 1, wherein the global interconnect contact extends through at least a dielectric material.

6. The device of claim 1, wherein at least a portion of the global interconnect contact is separated from the conductive landing pad by the nitride material.

7. An electronic system, comprising:
    at least one processor device operably coupled to at least one input device and at least one output device; and
    a device operably coupled to the at least one processor device, the device comprising:
        a conductive landing pad; and
        a conductive interconnect structure in electrical communication with the conductive landing pad, the conductive interconnect structure comprising:
            a first portion directly contacting the conductive landing pad; and
            a second portion in contact with the first portion, the second portion having a width greater than a width of the first portion and an aspect ratio greater than an aspect ratio of the first portion.

8. The electronic system of claim 7, further comprising a nitride liner on sides of the first portion.

9. The electronic system of claim 7, further comprising silicon dioxide on sides of the second portion.

10. The electronic system of claim 7, wherein the conductive interconnect structure is located in a peripheral region of the device.

11. The electronic system of claim 10, further comprising an array region comprising capacitor structures formed within a dielectric material.

12. The electronic system of claim 7, wherein at least an upper portion of the first portion is substantially surrounded by the second portion.

13. The electronic system of claim 7, wherein the second portion extends through at least one dielectric material and at least one nitride material.

14. The electronic system of claim 7, wherein the conductive interconnect structure is in electrical communication with at least one of digit lines associated with memory cells or driver circuitry associated with the memory cells.

15. The electronic system of claim 7, wherein the conductive landing pad is in electrical communication with a conductive line, the conductive line operably coupled to a sense amplifier.

16. A method of forming a device, the method comprising:
    forming a first nitride material over a base material in a region of the device;
    removing at least a portion of the first nitride material to expose at least a portion of a conductive landing pad through an opening;
    forming a contact plug through the first nitride material within the opening in electrical communication with the conductive landing pad, the contact plug having substantially vertical sidewalls;
    forming a second nitride material over at least the contact plug;
    removing a portion of the second nitride material to expose a portion of the contact plug; and
    forming a global interconnect contact over the exposed portion of the contact plug and in electrical communication with the contact plug, the global interconnect structure having an aspect ratio greater than an aspect ratio of the contact plug and a greater lateral width than the contact plug, the global interconnect structure having tapered sidewalls.

17. The method of claim 16, further comprising forming a dielectric material over the first nitride material prior to removing at least a portion of the first nitride material.

18. The method of claim 17, wherein removing a portion of the second nitride material to expose a portion of the contact plug further comprises removing a portion of the dielectric material to expose at least a portion of sidewalls of the contact plug.

19. The method of claim 17, further comprising removing a portion of the first nitride material to expose at least a portion of sidewalls of the contact plug after removing a portion of the second nitride material.

20. The method of claim 16, further comprising:
    forming a dielectric material over the second nitride material; and
    forming an opening having an aspect ratio greater than about 40:1 in the dielectric material to expose the second nitride material.

21. A method of forming a device, the method comprising:
    forming an opening through a nitride material to expose at least a portion of a conductive landing pad;
    forming a liner material over surfaces of the device and within the opening;
    forming a dielectric material over the liner material;
    forming an opening through the dielectric material to expose the liner material;

removing portions of the liner material and the nitride material to expose a portion of the conductive landing pad; and forming an electrically conductive material over the exposed portion of the conductive landing pad, forming the electrically conductive material comprising:

forming a contact plug extending through the nitride material and in electrical communication with the conductive landing pad, the contact plug having substantially vertical sidewalls; and forming a global interconnect contact in electrical communication with the contact plug and having a greater lateral width than the contact plug, the global interconnect contact comprising tapered sidewalls.

22. The method of claim 21, wherein removing portions of the liner material and the nitride material comprises removing laterally extending portions of the liner material while leaving the liner material on sidewalls of the opening.

23. A device, comprising:

conductive lines;

a conductive landing pad in electrical communication with a conductive line of the conductive lines; and a conductive interconnect structure in electrical communication with the conductive landing pad, the conductive interconnect structure comprising:

a contact plug in electrical communication with the conductive landing pad; and a global interconnect contact in electrical communication with the contact plug and having a greater lateral width than the contact plug, the global interconnect contact having an aspect ratio greater than about 40:1.

24. A device, comprising:

conductive lines;

a conductive landing pad in electrical communication with a conductive line of the conductive lines; and a conductive interconnect structure in electrical communication with the conductive landing pad, the conductive interconnect structure comprising:

a contact plug in electrical communication with the conductive landing pad; and a global interconnect contact in electrical communication with the contact plug and having a greater lateral width than the contact plug, a material composition of the contact plug substantially the same as a material composition of the global interconnect contact, the global interconnect contact having tapered sidewalls.

* * * * *

UNITED STATES PATENT AND TRADEMARK OFFICE
CERTIFICATE OF CORRECTION

PATENT NO.       : 11,158,571 B2
APPLICATION NO.  : 16/227492
DATED            : October 26, 2021
INVENTOR(S)      : Jonathan T. Doebler and Scott L. Light It is certified that error appears in the above-identified patent and that said Letters Patent is hereby corrected as shown below:

In the Specification
Column 5, Line 27, change "("SOT")" to --("SOI")--
Column 6, Line 16, change "(Sift)" to --($SiO_2$)--

Signed and Sealed this
Twenty-third Day of November, 2021

Drew Hirshfeld
*Performing the Functions and Duties of the*
*Under Secretary of Commerce for Intellectual Property and*
*Director of the United States Patent and Trademark Office*